(12) United States Patent
Lee et al.

(10) Patent No.: US 11,812,603 B2
(45) Date of Patent: Nov. 7, 2023

(54) MICROELECTRONIC DEVICES INCLUDING SEMICONDUCTIVE PILLAR STRUCTURES, AND RELATED ELECTRONIC SYSTEMS

(71) Applicant: Micron Technology, Inc., Boise, ID (US)

(72) Inventors: Si-Woo Lee, Boise, ID (US); Scott L. Light, Boise, ID (US); Song Guo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 16/992,615

(22) Filed: Aug. 13, 2020

(65) Prior Publication Data

US 2022/0051700 A1 Feb. 17, 2022

(51) Int. Cl.
*H01L 27/108* (2006.01)
*H10B 12/00* (2023.01)
*G11C 5/06* (2006.01)

(52) U.S. Cl.
CPC .......... *H10B 12/315* (2023.02); *G11C 5/063* (2013.01); *H10B 12/0335* (2023.02); *H10B 12/053* (2023.02); *H10B 12/34* (2023.02); *H10B 12/482* (2023.02); *H10B 12/485* (2023.02); *H10B 12/488* (2023.02)

(58) Field of Classification Search
CPC .............. G11C 5/063; H01L 27/10814; H01L 27/10823; H01L 27/10855; H01L 27/10876; H01L 27/10885; H01L 27/10888; H01L 27/10891; H01L 27/10805; H10B 12/0335; H10B 12/053; H10B 12/315; H10B 12/34; H10B 12/482; H10B 12/485; H10B 12/488; H10B 12/30
See application file for complete search history.

(56) References Cited

U.S. PATENT DOCUMENTS

| | | | |
|---|---|---|---|
| 8,394,680 B2 * | 3/2013 | Lee | H10B 12/48 438/599 |
| 11,501,804 B2 * | 11/2022 | Fishburn | H10B 12/485 |
| 2006/0043472 A1 | 3/2006 | Wang et al. | |
| 2014/0370684 A1 | 12/2014 | Khurana et al. | |
| 2015/0021684 A1 | 1/2015 | Lee et al. | |
| 2016/0099248 A1 | 4/2016 | Wu | |
| 2016/0104709 A1 | 4/2016 | Pulugurtha et al. | |
| 2017/0110364 A1 | 4/2017 | Song et al. | |
| 2018/0019245 A1 | 1/2018 | Yang et al. | |
| 2020/0027486 A1 | 1/2020 | Pandey et al. | |
| 2020/0066730 A1 | 2/2020 | Guo et al. | |

(Continued)

*Primary Examiner* — Shouxiang Hu
(74) *Attorney, Agent, or Firm* — TraskBritt

(57) ABSTRACT

A microelectronic device comprises semiconductive pillar structures each individually comprising a digit line contact region disposed laterally between two storage node contact regions. At least one semiconductive pillar structure of the semiconductive pillar structures comprises a first end portion comprising a first storage node contact region, a second end portion comprising a second storage node contact region, and a middle portion between the first end portion and the second end portion and comprising a digit line contact region, a longitudinal axis of the first end portion oriented at an angle with respect to a longitudinal axis of the middle portion. Related microelectronic devices, electronic systems, and methods are also described.

20 Claims, 18 Drawing Sheets

(56) References Cited

U.S. PATENT DOCUMENTS

| | | |
|---|---|---|
| 2020/0090929 A1 | 3/2020 | Tran et al. |
| 2020/0243534 A1 | 7/2020 | Liu |
| 2022/0051699 A1* | 2/2022 | Fishburn ........... H01L 27/10823 |

* cited by examiner

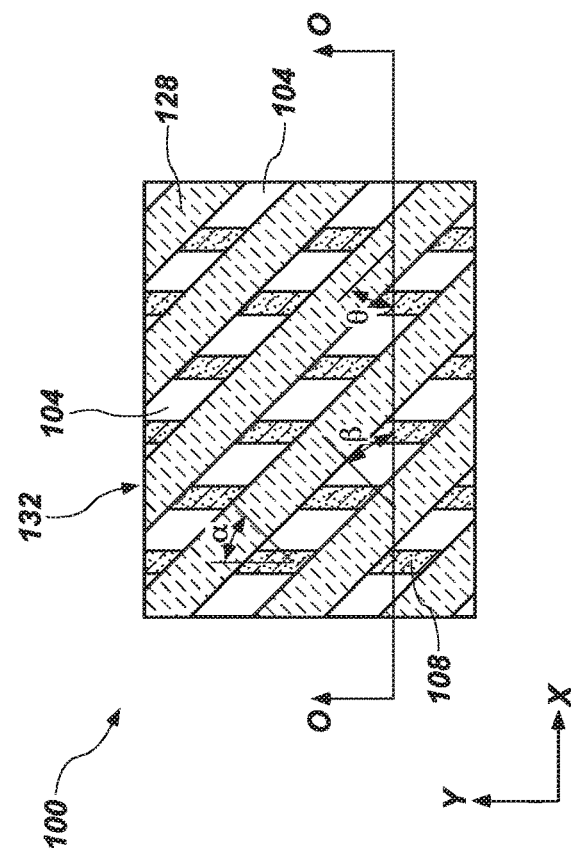
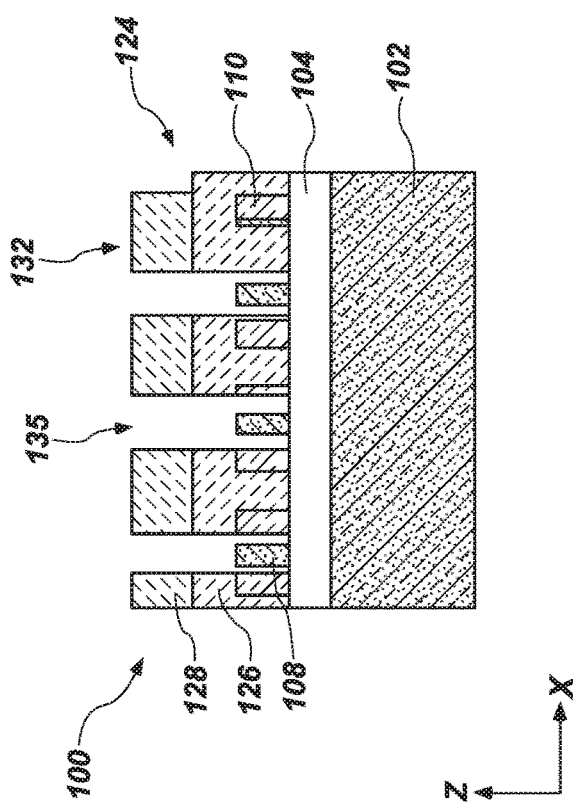

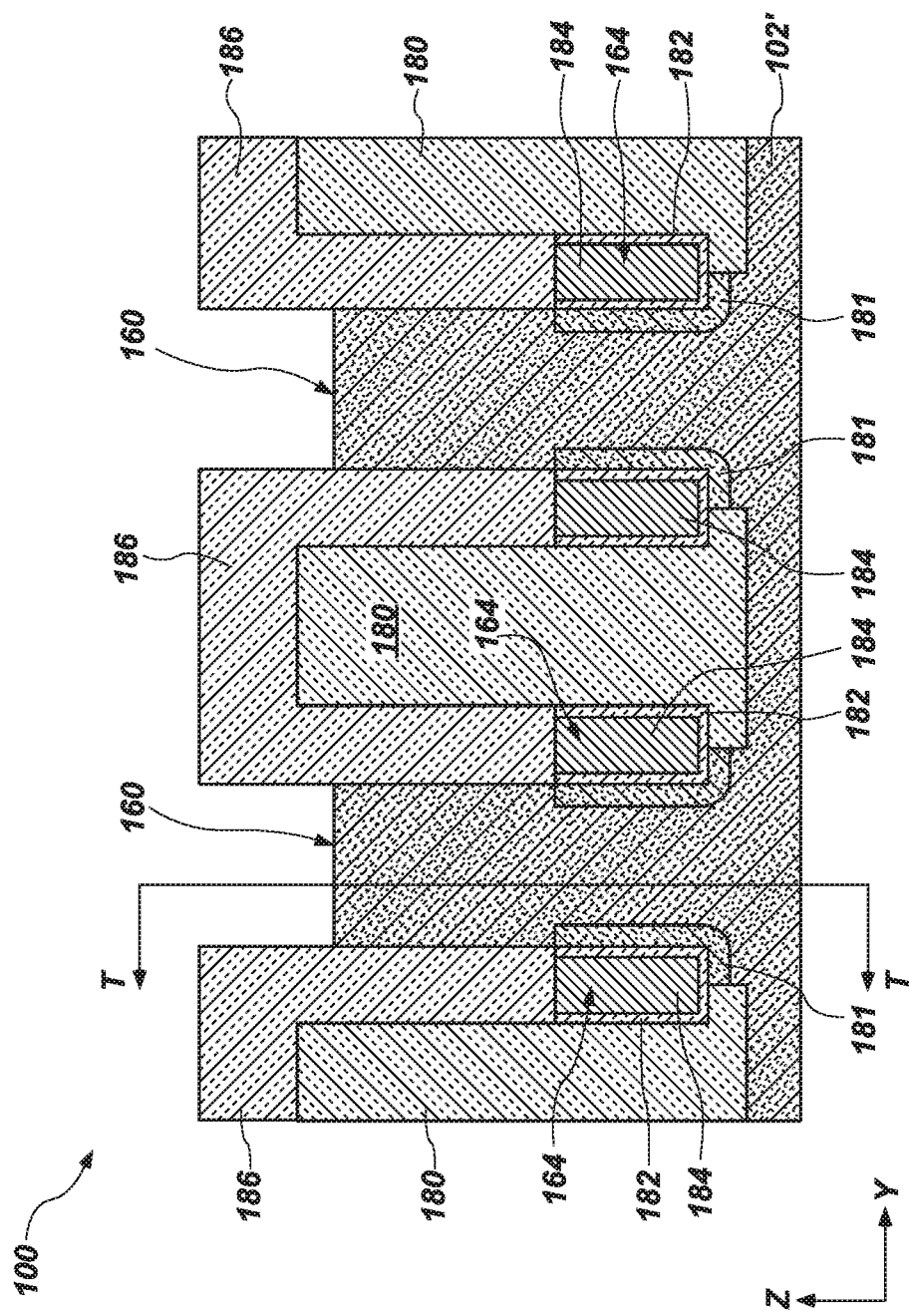

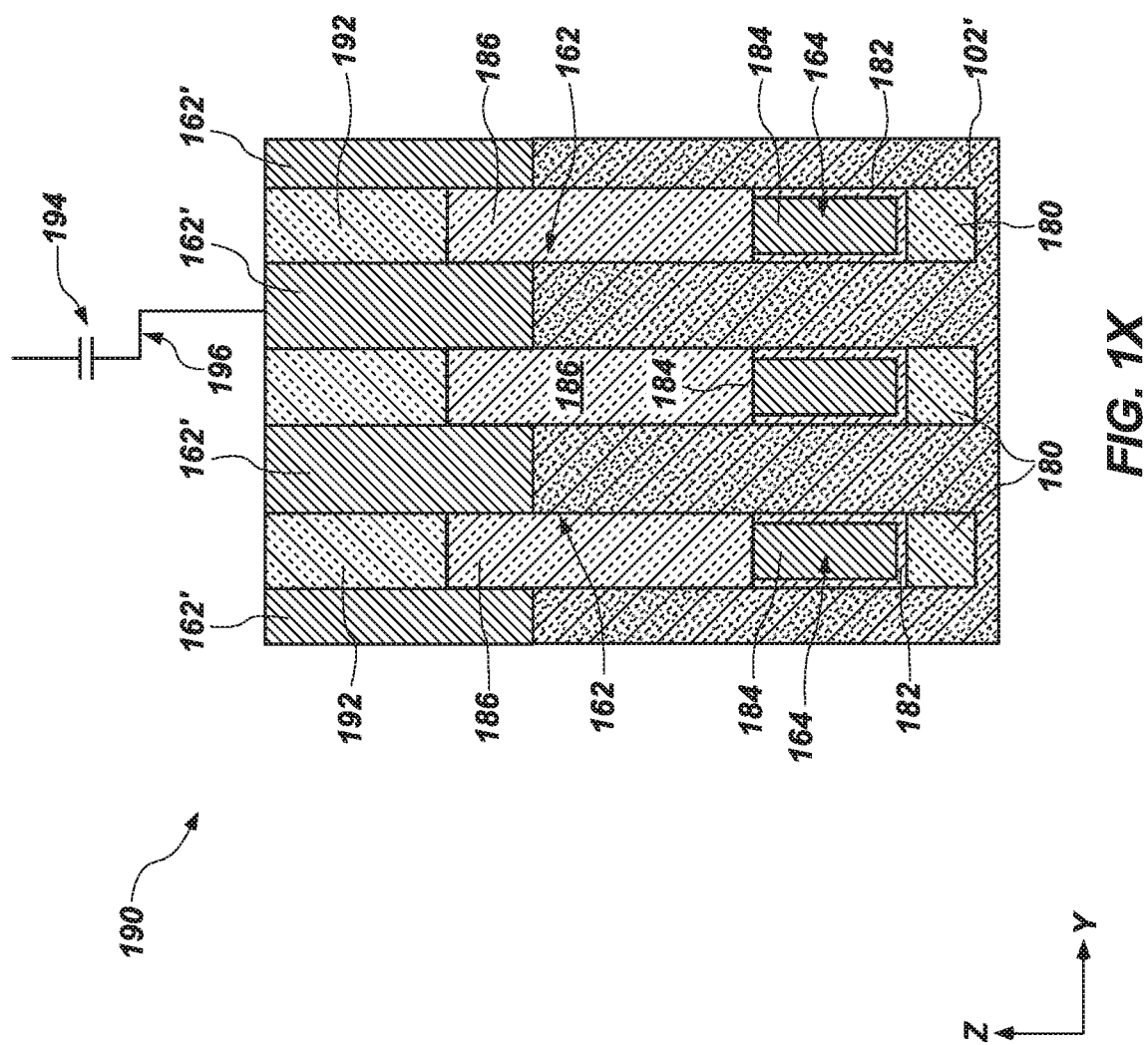

MICROELECTRONIC DEVICES INCLUDING SEMICONDUCTIVE PILLAR STRUCTURES, AND RELATED ELECTRONIC SYSTEMS

CROSS-REFERENCE TO RELATED APPLICATIONS

This application is related to U.S. patent application Ser. No. 16/992,589, filed Aug. 13, 2020, now U.S. Pat. No. 11,501,804, issued Nov. 15, 2022, for "MICROELECTRONIC DEVICES INCLUDING SEMICONDUCTIVE PILLAR STRUCTURES, AND RELATED METHODS AND ELECTRONIC SYSTEMS."

TECHNICAL FIELD

The disclosure, in various embodiments, relates generally to the field of microelectronic device design and fabrication. More specifically, the disclosure relates to methods of forming microelectronic devices comprising semiconductive pillar structures, and to related microelectronic devices and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM), In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, one of the limiting factors in the continued shrinking of memory devices is inadvertent shorting between contacts associated with various components of the DRAM cells. As used herein, a "contact" refers to a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored. As the dimensions of the memory device (e.g., DRAM device) features decrease, the packing density of the contacts associated therewith increases, resulting in an increased likelihood of inadvertently shorting various components together, which can adversely affect memory device performance. In some instances, the digit line contact may inadvertently contact the storage node contact, electrically shorting the digit line to the storage node and resulting in failure of the memory cell associated with the storage node.

DETAILED DESCRIPTION

Figure 1B:
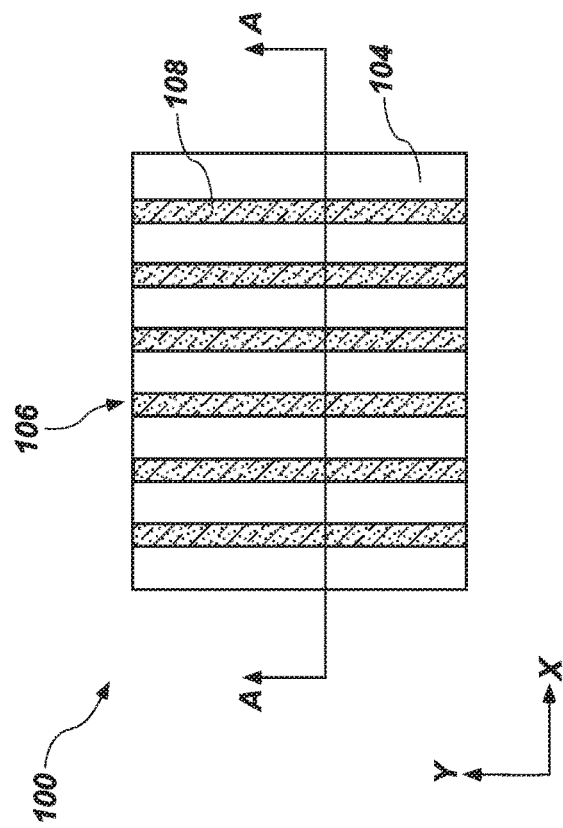
FIG. 1A through FIG. 1X are simplified partial cross-sectional views (FIG. 1A, FIG. 1C, FIG. 1E, FIG. 1H, FIG. 1J, FIG. 1L, FIG. 1N, FIG. 1S, FIG. 1T, and FIG. 1V through FIG. 1X) and simplified partial top-down views (FIG. 1B, FIG. 1D, FIG. 1F, FIG. 1G, FIG. 1I, FIG. 1K, FIG. 1M, FIG. 1O through FIG. 1R, and FIG. 1U) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a DRAM memory device, a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "adjacent" one another means and includes features of the disclosed identity (or identities) that are located most proximate (e.g., closest to, neighboring) one another. Additional features (e.g., additional regions, additional materials, additional structures, additional devices) not matching the disclosed identity (or identities) of the "adjacent" features may be disposed between the "adjacent" features. Put another way, the "adjacent" features may be positioned directly neighboring one another, such that no other feature intervenes between the "adjacent" features; or the "adjacent" features may be positioned indirectly adjacent one another, such that at least one feature having an identity other than that associated with at least one the "adjacent" features is positioned between the "adjacent" features. Accordingly, features described as "vertically adjacent" one another means and includes features of the disclosed identity (or identities) that are located most vertically proximate (e.g., vertically closest to, vertically neighboring) one another. Moreover, features described as "horizontally adjacent" one another means and includes features of the disclosed identity (or identities) that are located most horizontally proximate (e.g., horizontally closest to, horizontally neighboring) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes an electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes an electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including the insulative material.

As used herein, a "selectively removable" material means and includes a material that exhibits a greater removal rate responsive to process conditions, such as exposure to radiation (e.g., heat), relative to another material exposed to the same process conditions. A material that is selectively removable relative to another material is substantially completely removable without substantially removing the another material (e.g., without removing substantially any of the another material).

As used herein, a "selectively etchable" material means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

According to embodiments described herein, a microelectronic device includes semiconductive pillar structures (e.g., elongate semiconductive pillar structures having a larger length than a width thereof), elongate semiconductive pillar structure including a bit line contact region laterally disposed between two storage node contact regions. The bit line contact region may be in electrical communication with a bit line contact that is, in turn, in electrical communication with a bit line extending in a first lateral direction. Each of the storage node contact regions is individually in electrical communication with a storage node contact, each of which is in electrical communication with a storage node (e.g., a capacitor, which may also be referred to herein as a cell capacitor). Each semiconductive pillar structure may include a central portion including the bit line contact region, a first end portion at a first end of the central portion, and a second end portion at a second, opposite end of the central portion. The first end portion includes a first one of the storage node contact regions and the second end portion includes a second one of the storage node contact regions. The central portion may extend in the first lateral direction and include a longitudinal axis substantially parallel with the bit line. In other words, the central portion may be elongated in a direction in which the bit line extends. Each of the first end portion and the second end portion include a longitudinal axis that is oriented at an angle with respect to the longitudinal axis of the central portion. Stated another way, each of the first end portion and the second end portion extend at an angle with respect to the central portion. In some embodiments, the semiconductive pillar structures exhibit a so-called "S" shape.

Orienting the first end portion and the second end portion at an angle with respect to the central portion facilitates an increased distance between the storage node contact regions and the bit line contact region of the semiconductive pillar structure, reducing a likelihood of inadvertent shorting between such features compared to conventional microelectronic devices. In addition, orienting the first end portion and the second end portion at an angle with respect to the central portion facilitates an increased active area of the semiconductive pillar structures (e.g., an increased active area for the bit line contacts and each of the storage node contacts). Further, forming the end portions at an angle with respect to the central portion may facilitate an increased area (e.g., a greater margin) for formation of the bit line contact on the bit line contact region and formation of spacers along the bit lines, which spacers may reduce capacitive coupling between the bit lines. In some embodiments, the shape of the semiconductive pillar structures may reduce (e.g., eliminate) an overlap between word line structures and the bit line contact regions of the semiconductive pillar structures compared to conventional pillar structures. In some embodiments, forming the first end portion and the second end portion at an angle with respect to the central portion may facilitate increased mechanical stability (and a reduction in toppling) of the semiconductive pillar structures compared to conventional pillar structures that exhibit a linear shape. Further, a distance between so-called passing word line structures that vertically overlie a semiconductive pillar structure but do not electrically couple thereto, may be increased, reducing inadvertent coupling between adjacent word lines and so-called "row hammer."

The microelectronic device may be formed by patterning a first group of lines comprising a first sacrificial material extending in the first lateral direction adjacent to (e.g., on, over, vertically overlying) a base material on which one or more features are to be formed. In some embodiments, the first group of lines are formed by a pitch quadrupling process or a spacer assisted double patterning (SAPD) process such that the lines of the first group of lines exhibit a desired dimension and spacing that may not be achieved by conventional photolithography processes. Spaces between the lines of the first group of lines may be filled with a nitride material exhibiting an etch selectivity with respect to the first sacrificial material. A first dielectric anti-reflective coating (DARC) material is formed adjacent to (e.g., on, over, vertically overlying) the first group of lines and the nitride material, and a second group of lines comprising a second sacrificial material is formed adjacent to (e.g., on, over, vertically overlying) the first DARC material. In some embodiments, the lines of the second group of lines are formed by a pitch doubling process. The lines of the second group of lines may be oriented at an angle with respect to one or more features (e.g., word line structures) to be formed on the microelectronic device that extend in a second lateral direction, such as an angle within a range from about 30° to about 60°. In some embodiments, the angle is about 41°. In some embodiments, the lines of the second group of lines are oriented at another angle with respect to the lines of the first group of lines, such as from about 30° to about 60°.

Spacers comprising an oxide material may be formed on the lines of the second group of lines. A first etch (e.g., a first chop etch) process may pattern a portion of the nitride material and the lines of the first group of lines. The first etch process may remove exposed portions of the first DARC material through the oxide material and selectively remove exposed portions of the nitride material, the lines of the second group of lines, and exposed portions of the first group of lines. A second etch (e.g., a second chop etch) process may remove portions of the first DARC material exposed by the first etch and may selectively remove exposed portions of the nitride material selective to the first sacrificial material and the oxide material. After performing the second etch process, remaining portions of the oxide material and the first DARC material may be removed (e.g., stripped) to expose the remaining portions of the first sacrificial material and the nitride material. An underlayer material may be formed adjacent to (e.g., on, over, vertically overlying) the first sacrificial material and the nitride material and a second DARC material may be patterned over the underlayer material by a so-called reverse pitch doubling process. The microelectronic device structure may be exposed to a third etch (e.g., a third chop etch) process by removing portions of the second DARC material, and exposed portions of the underlayer material and the nitride material selective to the first sacrificial material. Removal of the portions of the second DARC material and the underlayer material may form lines of the underlayer material extending at an angle with respect to the first lateral direction. After removing the nitride material, the underlayer material may be removed and the remaining portions of the nitride material and the first sacrificial material may be used as a mask to transfer the pattern thereof into an etch stop material over the base material. The pattern may be transferred from the etch stop material to the base material to form the semiconductive pillars structures.

Figure 1A:
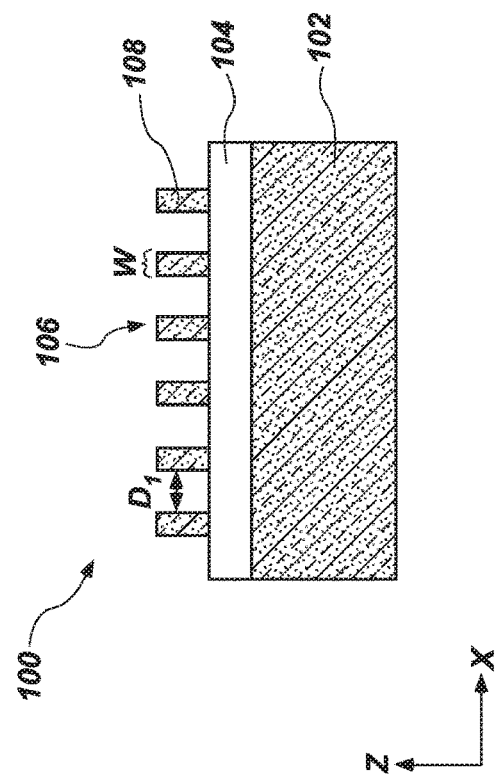

FIG. 1A through FIG. 1X are simplified partial cross-sectional views (FIG. 1A, FIG. 1C, FIG. 1E, FIG. 1H, FIG. 1J, FIG. 1L, FIG. 1N, FIG. 1S, FIG. 1T, and FIG. 1V through FIG. 1X) and simplified partial top-down views (FIG. 1B, FIG. 1D, FIG. 1F, FIG. 1G, FIG. 1I, FIG. 1K, FIG. 1M, FIG. 1O through FIG. 1R, and FIG. 1U) illustrating a method of forming a microelectronic device structure (e.g., a memory device structure, such as a DRAM device structure) for a microelectronic device (e.g., a memory device, such as a DRAM device), in accordance with embodiments of the disclosure. With the description provided below, it will be readily apparent to one of ordinary skill in the art that the methods described herein may be used in various devices. In other words, the methods of the disclosure may be used whenever it is desired to form a microelectronic device including the pillar structures.

Referring to FIG. 1A and FIG. 1B, a microelectronic device structure 100 may include a base material 102, an etch stop material 104 adjacent to (e.g., on, over, vertically overlying) the base material 102, and first lines 106 of a first sacrificial material 108 adjacent to (e.g., on, over, vertically overlying) the etch stop material 104. FIG. 1A is a cross-sectional view of the microelectronic device structure 100 taken through section line A-A of FIG. 1B.

The base material 102 may include a semiconductor substrate, a base semiconductor material on a supporting substrate, a metal electrode, or a semiconductor substrate having one or more materials, structures, or regions formed thereon. The base material 102 may comprise a semiconductive material, such as a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form materials, regions, or junctions in the base semiconductor structure or foundation. The base material 102 may include one or more materials associated with integrated circuity fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

The etch stop material 104 may be formed of and include one or more materials exhibiting an etch selectivity to various mask materials (e.g., chop masks), as will be described herein. By way of non-limiting example, the etch stop material 104 may exhibit an etch selectivity with respect to various materials, such as sacrificial materials (e.g., amorphous carbon), dielectric materials (e.g., silicon dioxide, silicon nitride), a dielectric anti-reflective coating (DARC) material, and a bottom anti-reflective coating (BARC) material. The etch stop material 104 may be formed of and include one or more of a metal nitride (e.g., titanium nitride, tungsten nitride, tantalum nitride, aluminum nitride), a metal oxide (e.g., aluminum oxide, titanium oxide, tungsten oxide, tantalum oxide, hafnium oxide, zirconium oxide), an oxynitride material, a silicon oxycarbide, a silicon carboxynitride material, amorphous carbon, or another material. In some embodiments, the etch stop material 104 comprises titanium nitride.

The first sacrificial material 108 may be formed of and include a material exhibiting an etch selectivity with respect to one or more oxide materials (e.g., silicon dioxide), one or more nitride materials (e.g., silicon nitride, titanium nitride), and one or more DARC materials. In some embodiments, the first sacrificial material 108 is formed of and includes amorphous silicon, such as hydrogenated amorphous silicon.

Each of the first lines 106 of the first sacrificial material 108 may have substantially the same width W (e.g., minor lateral dimension), and may be regularly spaced by substantially the same distance $D_1$. Accordingly, a pitch between centerlines of adjacent first lines 106 may be substantially uniform throughout the first sacrificial material 108. The dimensions and spacing of the first lines 106 may be selected to provide desired lateral dimensions and lateral spacing to features to be subsequently formed from the base material 102, as will be further described below.

In some embodiments, the width W of the each line of the first lines 106 may be within a range from about 10 nm to about 20 nm, such as from about 10 nm to about 15 nm, or from about 15 nm to about 20 nm. However, the disclosure is not so limited, and the width W of the lines of the first lines 106 may be different than those described above.

The distance $D_1$ between adjacent lines of the first lines 106 may be within a range from about 20 nm to about 40 nm, such as from about 20 nm to about 25 nm, from about 25 nm to about 30 nm, from about 30 nm to about 35 nm, or from about 35 nm to about 40 nm. However, the disclosure is not so limited, and the distance $D_1$ between adjacent lines of the first lines 106 may be different than those described above.

The first lines 106 may be formed by a so-called "pitch quadrupling" process to form the first lines 106 exhibiting the desired width W and distance $D_1$. In other embodiments, the first lines 106 are formed by a spacer assisted double patterning (SAPD) process. The first lines 106 may be formed by conventional techniques. By way of non-limiting example, lines (which may also be referred to as "mandrels") of a first material may be formed adjacent to (e.g., on, over, vertically overlying) the etch stop material 104. A first spacer material may be formed on the lines of the first material, and the lines of the first material may be removed (e.g., stripped, etched), leaving the first spacers. A second spacer material may be formed on sides of the first spacers and the first spacers may be removed (e.g., stripped, etched), leaving a pattern of second spacers. The pattern of the second spacers may correspond to the first lines 106 of the first sacrificial material 108.

Figure 1D:
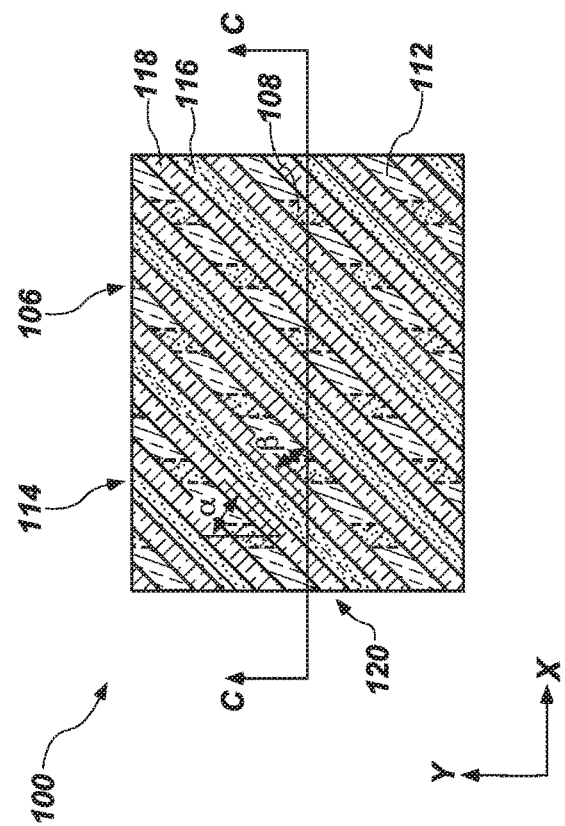
Figure 1C:
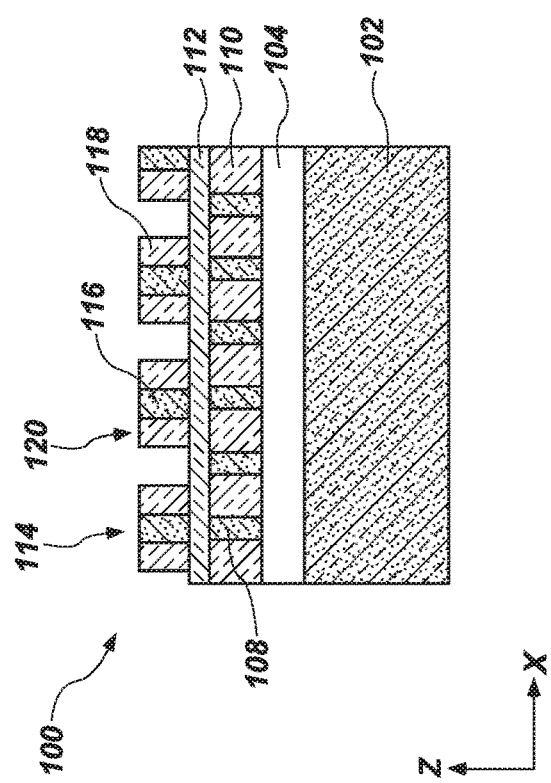

Referring to FIG. 1C and FIG. 1D, a nitride material 110 may be formed in spaces between adjacent first lines 106 of the first sacrificial material 108, and a first DARC material 112 may be formed adjacent to (e.g., on, over, vertically overlying) the nitride material 110 and the first lines 106 of the first sacrificial material 108. Lines 114 of a second sacrificial material 116 may be formed adjacent to (e.g., on, over, vertically overlying) the first DARC material 112, and an oxide material 118 may be formed adjacent to (e.g., on sides of) the lines 114 of the second sacrificial material 116. The lines 114 of the second sacrificial material 116 may be referred to herein as "second lines." The oxide material 118 may be configured as spacers located adjacent to (e.g., on sides) of the second lines 114 of the second sacrificial material 116. The oxide material 118 may extend as lines 120 that are substantially parallel to and substantially coextensive with the second lines 114 of the second sacrificial material 116.

The nitride material 110 may be formed by one or more of CVD, ALD, PVD, LPCVD, PECVD, spin-on coating, blanket coating, or other methods. In some embodiments, after forming the nitride material 110, portions of the nitride material 110 over the upper surfaces of the first lines 106 of the first sacrificial material 108 may be removed. For example, the microelectronic device structure 100 may be exposed to a chemical mechanical planarization (CMP) process to remove portions of the nitride material 110 from upper surfaces of the first sacrificial material 108 such that upper surfaces of the nitride material 110 are substantially coplanar with upper surfaces of the first sacrificial material 108.

The nitride material 110 may be formed of and include a dielectric nitride, such as one or more of silicon nitride, aluminum nitride, an oxynitride, or another material. In some embodiments, the nitride material 110 comprises silicon nitride. In some embodiments, the nitride material 110 exhibits an etch selectivity with respect to the first sacrificial material 108 and the oxide material 118.

The first DARC material 112 may be formed of and include a silicon oxynitride material, such as $Si_xO_yN_z$, wherein x is between about 10 and about 60, y is between about 20 and about 50, and z is between about 10 and about 20. In some embodiments, the first DARC material 112 comprises a silicon rich silicon oxynitride. However, the disclosure is not so limited and the first DARC material 112 may include other suitable DARC materials that may be known in the art. The first DARC material 112 may be formulated and configured to substantially prevent reflection of electromagnetic radiation (e.g., a light source) during patterning of various materials.

After forming the first DARC material 112, the second lines 114 of the second sacrificial material 116 may be formed adjacent to (e.g., on, over, vertically overlying) the first DARC material 112. In some embodiments, the second lines 114 are formed by one or more of CVD, ALD, PVD, LPCVD, PECVD, spin-on coating, blanket coating, or other methods. By way of non-limiting example, the second lines 114 may be formed by a so-called "pitch doubling" process. In some such embodiments, lines of a first material may be patterned and the second sacrificial material 116 may be formed adjacent to (e.g., on sides of) the lines of the first material. After forming the second sacrificial material 116 adjacent to the lines of the first material, the lines of the first material may be removed.

The second sacrificial material 116 may be formed of and include one or more of the materials described above with reference to the first sacrificial material 108. In some embodiments, the second sacrificial material 116 comprises amorphous silicon. In some embodiments, the second sacrificial material 116 comprises the same material composition as the first sacrificial material 108.

After forming the second lines 114 of the second sacrificial material 116, the oxide material 118 may be formed on sides of the second lines 114 of the second sacrificial material 116. The oxide material 118 may be formed by one or more of CVD, ALD, PVD, LPCVD, PECVD, spin-on coating, blanket coating, or other methods.

The oxide material 118 may be formed of and include an oxide material exhibiting an etch selectivity with respect to the second sacrificial material 116, the first sacrificial material 108, and the nitride material 110. For example, the oxide material 118 may be formed of and include a dielectric material, such as silicon dioxide.

With reference to FIG. 1D, the second lines 114 of the second sacrificial material 116 may be formed at a first angle α with respect to a first lateral direction (e.g., the Y-direction) in which the first lines 106 of the first sacrificial material 108 extend and at a second angle β with respect to a second lateral direction (e.g., the X-direction) in which one or more subsequently formed structures (e.g., access lines, such as word lines) may laterally extend. The first angle α of the second lines 114 and the lines 120 with respect to the first lateral direction may be greater than about zero (0) degrees and less than about ninety (90) degrees relative to the first lateral direction, such as within a range of from about twenty (20) degrees to about seventy (70) degrees, from about thirty (30) degrees to about sixty (60) degrees, or from about forty (40) degrees to about fifty (50) degrees. The first angle α may be selected at least partially based on a desired architecture of the microelectronic device structure 100, and on desired dimensions of features to be formed from the base material 102, as will be described below. In some embodiments, the first angle α is about forty-nine (49) degrees.

The second angle β between the second lines 114 of the second sacrificial material 116 and second lateral direction (e.g., the X-direction) may be greater than about zero (0) degrees and less than about ninety (90) degrees, such as within a range from about (20) degrees to about seventy (70) degrees, from about thirty (30) degrees to about sixty (60) degrees, or from about forty (40) degrees to about fifty (50) degrees. In some embodiments, the second angle β may be about forty-one (41) degrees. In some embodiments, a sum of the first angle α and the second angle β may be about ninety (90) degrees.

It will be understood that since the lines 120 of the oxide material 118 are substantially coextensive with the second lines 114 of the additional sacrificial material 116, an angle between the lines 120 of the oxide material 118 and the first lateral direction may be the same as the first angle α and an angle between the lines 120 of the oxide material 118 and the second lateral direction may be the same as the second angle β.

With continued reference to FIG. 1D, it will be understood that the first lines 106 of the first sacrificial material 108 would not be visible from a top view since they are located under the first DARC material 112. Accordingly, the first lines 106 are illustrated in broken lines in FIG. 1D to illustrate that they are located underneath the first DARC material 112. It will be understood that structures illustrated in broken lines herein are located underneath one or more materials.

Figure 1F:
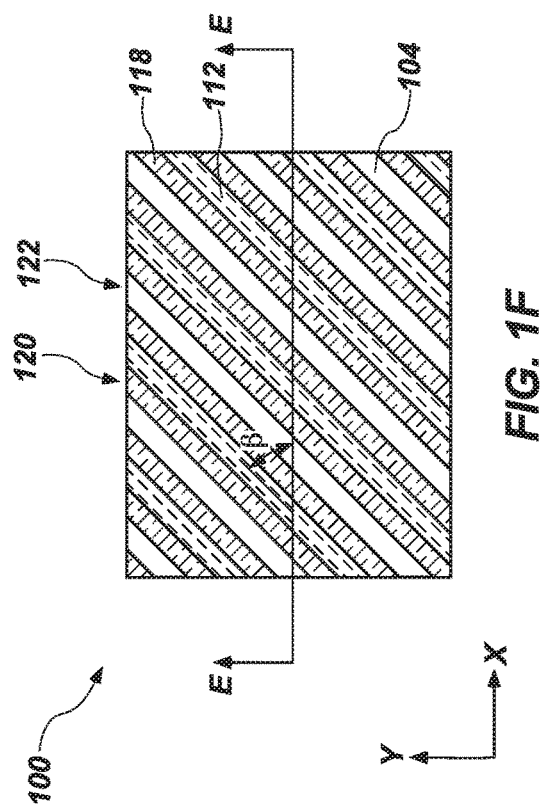
Figure 1G:
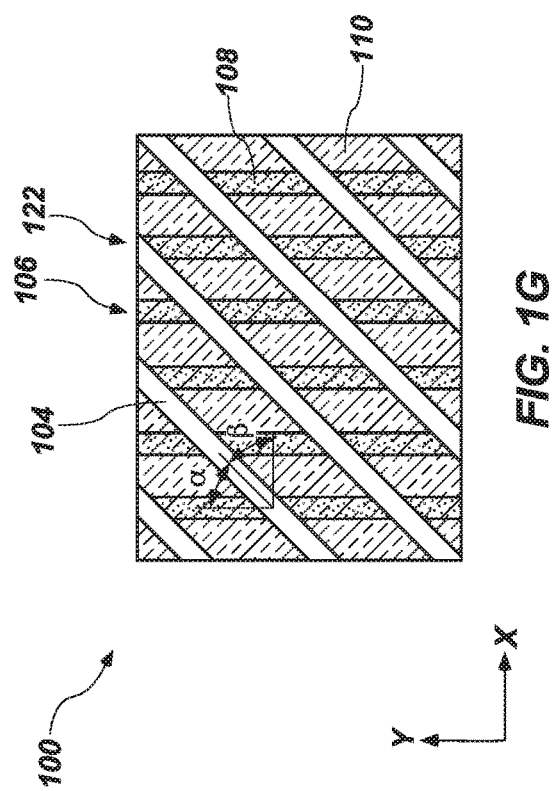
Figure 1E:
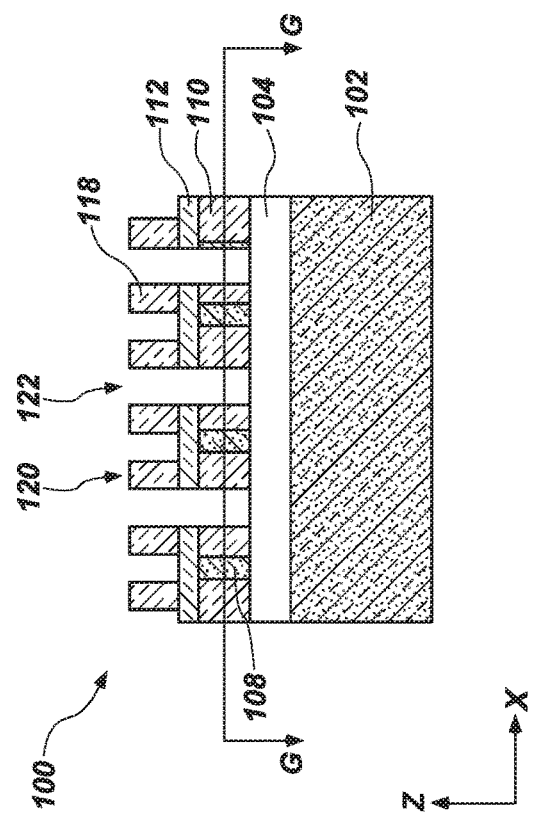

FIG. 1E is a simplified cross-sectional view of the microelectronic device structure 100 of FIG. 1F taken through section line E-E of FIG. 1F. With reference to FIG. 1E and FIG. 1F, the microelectronic device structure 100 may be exposed to a first removal process (e.g., an etch process, such as a first chop etch process). For example, the exposed portions of the first DARC material 112 may be removed (e.g., punched through) and exposed portions of the second sacrificial material 116, the nitride material 110, and the first sacrificial material 108 may be removed selective to which the oxide material 118 to form first trenches 122 through which the etch stop material 104 may be exposed. Stated another way, portions of the first DARC material 112, the second sacrificial material 116, the nitride material 110, and the first sacrificial material 108 may be removed without substantially removing portions of the oxide material 118. In some embodiments, a height (e.g., in the Z-direction) of the oxide material 118 may be selected such that the height of the oxide material 118 remains substantially the same after removing portions of the first DARC material 112, the second sacrificial material 116, the nitride material 110, and the first sacrificial material 108. It will be appreciated that a material is considered selectively, or preferentially, etched when the etch rate for that material upon exposure to a given etchant is substantially greater, or on the order of 2-3 times greater to at least about 40 times greater than the etch rate for adjacent materials exposed to the same etchant.

By way of non-limiting example, the microelectronic device structure 100 may be exposed to a plasma including one or more of methane ($CH_4$), trifluoromethane ($CHF_3$) (also referred to as chloroform), difluoromethane ($CH_2F_2$), sulfur hexafluoride ($SF_6$), or another material to remove the portions of the first DARC material 112, the second sacrificial material 116, the nitride material 110, and the first sacrificial material 108 without substantially removing portions of the oxide material 118. Of course, the disclosure is not so limited and the portions of the first DARC material 112, the second sacrificial material 116, the nitride material 110, and the first sacrificial material 108 may be removed by other etchants without substantially removing portions of the oxide material 118.

As described above, in some embodiments, removing portions of the first DARC material 112, the second sacrificial material 116, and the nitride material 110 may expose portions of the etch stop material 104. For example, the etch stop material 104 may be exposed at a lower portion of the first trenches 122, which may extend substantially parallel to the lines 120 of the oxide material 118.

FIG. 1G is a simplified top view of the microelectronic device structure of FIG. 1E taken through section line G-G of FIG. 1E and illustrates the top view of the microelectronic device structure 100 without the oxide material 118 or the first DARC material 112. As illustrated in FIG. 1G, portions of the first sacrificial material 108 are removed through the openings in the first DARC material 112 to expose the etch stop material 104 and separate (e.g., divide) the first lines 106 of the first sacrificial material 108 into different isolated portions.

Figure 1I:
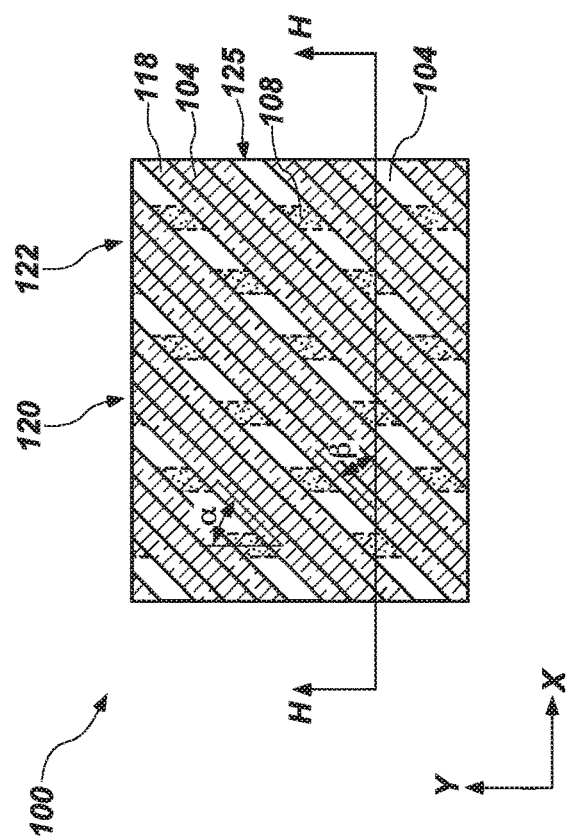
Figure 1H:
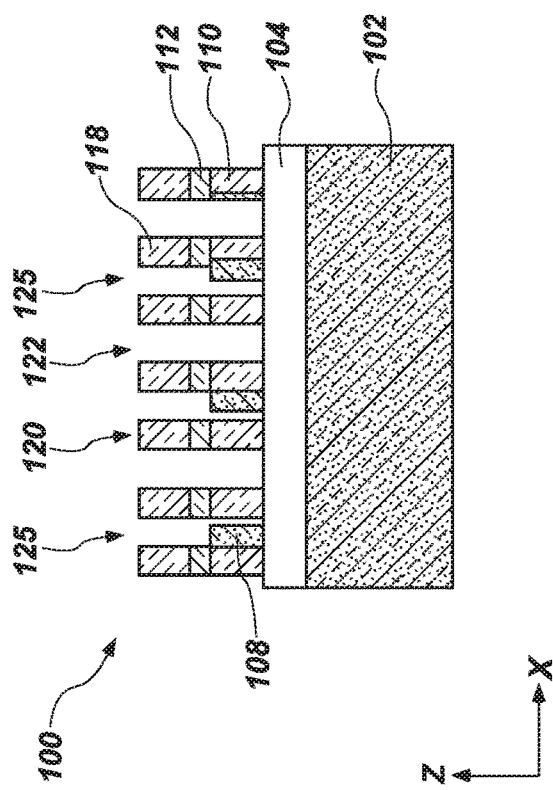

With reference now to FIG. 1H and FIG. 1I, the microelectronic device structure 100 may be exposed to a second removal process (e.g., a second etch process, such as a second chop etch process). FIG. 1H is a cross-sectional view of the microelectronic device structure 100 of FIG. 1I taken through section line H-H of FIG. 1I. With combined reference to FIG. 1H and FIG. 1I, portions of the first DARC material 112 (e.g., portions of the first DARC material 112 exposed between the oxide material 118) may be removed. The first DARC material 112 may be removed in substantially the same manner described above with reference to removal of the portions of the first DARC material 112 with respect to FIG. 1E and FIG. 1F. With reference to FIG. 1I, removal of the portions of the first DARC material 112 may expose portions of the first sacrificial material 108 between adjacent lines 120 of the oxide material 118.

After removing the additional portions of the first DARC material 112, exposed portions of the nitride material 110 may be selectively removed with respect to the oxide material 118 and the first sacrificial material 108. By way of non-limiting example, the exposed portions of the nitride material 110 may be exposed to a plasma including one or more of $CH_4$, $CHF_3$, $CH_2F_2$, $SF_6$, or another material to selectively remove the exposed portions of the nitride material 110. Removing the portions of the nitride material 110 may expose underlying portions of the etch stop material 104.

Removal of the portions of the nitride material 110 may form second trenches 125 spaced from the first trenches 122 by the lines 120 of the oxide material 118. In some embodiments, a length (e.g., a major dimension) of the second trenches 125 may be less than a corresponding length of the first trenches 122. Stated another way, the second trenches 125 may be interrupted by the portions of the first sacrificial material 108 remaining and not removed during formation of the first trenches 122. In some embodiments, the second trenches 125 extend at the first angle α between the first lines 106 (FIG. 1G) of the first sacrificial material 108 and at the second angle β with respect to the second lateral direction (e.g., the X-direction).

With reference to FIG. 1E through FIG. 1I, in some embodiments, the selective removal of the portions of the first DARC material 112, the nitride material 110, the second sacrificial material 116, and the first sacrificial material 108 (e.g., the first removal process), may be performed separately from the removal of the additional portions of the first DARC material 112 and the nitride material 110, described with reference to FIG. 1H and FIG. 1I (e.g., the second chop etch). In some such embodiments, the microelectronic device structure 100 may be exposed to one or more cleaning processes between such removal processes. In other embodiments, the removal of the additional portions of the first DARC material 112 and the nitride material 110 may be performed in the same etch chamber as the selective removal of the portions of the first DARC material 112, the nitride material 110, the second sacrificial material 116, and the first sacrificial material 108 without performing a cleaning process between the removal processes. In addition, although FIG. 1E through FIG. 1I have been described and illustrated as performing the first etch process prior to the second etch process, the disclosure is not so limited. In other embodiments, the additional portions of the first DARC material 112 and the nitride material 110, described with reference to FIG. 1H and FIG. 1I, may be removed prior to removal of the portions of the first DARC material 112, the nitride material 110, the second sacrificial material 116, and the first sacrificial material 108, as described with reference to FIG. 1E and FIG. 1F.

Figure 1K:
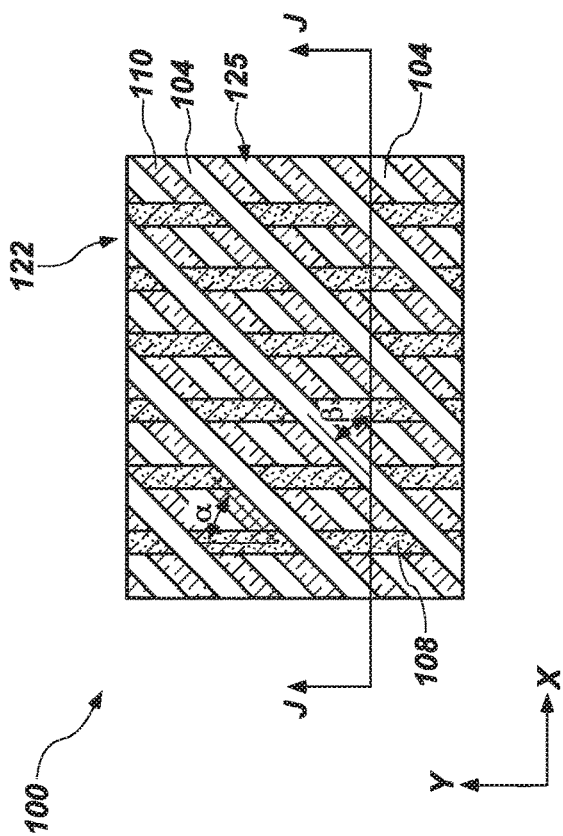
Figure 1J:
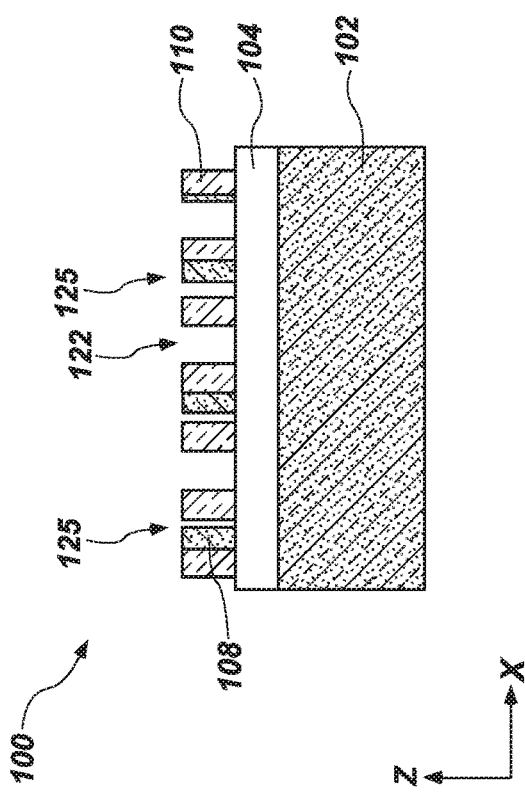

Referring to FIG. 1J and FIG. 1K, the oxide material 118 and the DARC material 112 may be removed from surfaces of the microelectronic device structure 100 to expose additional portions of the nitride material 110 and the first sacrificial material 108. In some embodiments, the oxide material 118 is removed by exposing the microelectronic device structure 100 to a wet etch process, such as one or more of hydrofluoric acid, nitric acid, ammonium fluoride (a mixture of ammonium fluoride and hydrofluoric acid), or another material. In some embodiments, the oxide material 118 is removed by exposing the microelectronic device structure 100 to a mixture of hydrofluoric acid and ammonium fluoride.

Figure 1M:
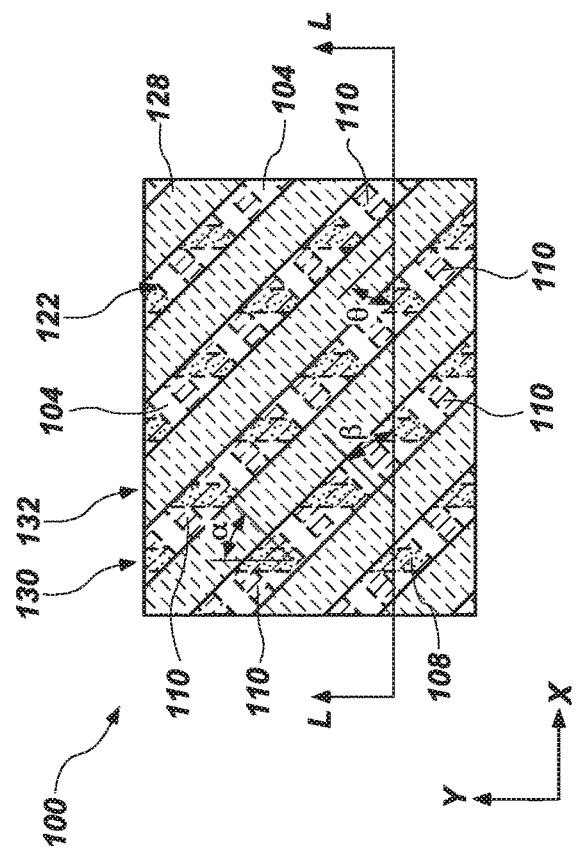
Figure 1L:
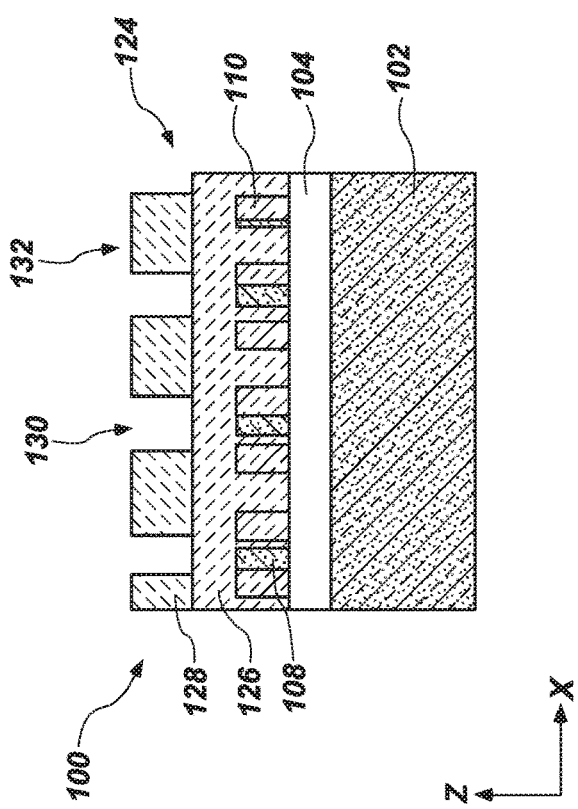

FIG. 1L and FIG. 1M illustrate the microelectronic device structure 100 after forming a mask 124 adjacent to (e.g., on, over, vertically overlying) the nitride material 110 and the first sacrificial material 108. FIG. 1L is a cross-sectional view of the microelectronic device structure 100 of FIG. 1M taken through section line L-L of FIG. 1M.

The mask 124 may include an underlayer material 126 adjacent to (e.g., on, over, vertically overlying) the nitride material 110 and the first sacrificial material 108, and a second DARC material 128 adjacent to (e.g., on, over, vertically overlying) the underlayer material 126. The mask 124 may be used to conduct a third etch process (e.g., a third chop etch process) on the microelectronic device structure 100.

The underlayer material 126 may fill spaces between adjacent portions of the nitride material 110 and the first sacrificial material 108 and may contact the etch stop material 104 at lower portions of the first trenches 122 and the second trenches 125. After forming the underlayer material 126, the microelectronic device structure 100 may be exposed to a planarization process, such as CMP, to substantially planarize the upper surface of the underlayer material 126.

The underlayer material 126 may be formed of and include an organic material, such as one or more of a bottom anti-reflective coating (BARC) material, an extreme ultraviolet (EUV) underlayer material, a polymeric material, or another material. In some embodiments, the underlayer material 126 comprises a BARC material.

The second DARC material 128 may be formed of and include one or more of the materials described above with reference to the first DARC material 112. In some embodiments, the second DARC material 128 comprises the same material composition as the first DARC material 112. The second DARC material 128 may be formulated and configured to exhibit an etch selectivity with respect to each of the etch stop material 104, the first sacrificial material 108 and the nitride material 110.

The second DARC material 128 may be patterned by conventional techniques to include openings 130 (FIG. 1L) therein. By way of non-limiting example, the second DARC material 128 may be patterned by a so-called "reverse self-aligned double patterning" (also referred to as "reverse pitch doubling") process. In some embodiments, the second DARC material 128 may be formed and patterned to include recessed portions corresponding to the location of the openings 130. The recessed portions may be removed (e.g., punched through) to expose the underlayer material 126 and form lines 132 of the second DARC material 128 spaced by the openings 130.

For clarity and ease of understanding of the disclosure, the underlayer material 126 is not illustrated in the top view of FIG. 1M. It will be understood that the materials illustrated between the lines 132 of the additional DARC material 128 (i.e., within the openings 130) in FIG. 1M are located vertically underneath the underlayer material 126.

The lines 132 of the second DARC material 128 may extend at a third angle $\theta$ with respect to the first lateral direction (e.g., the X-direction) in which one or more subsequently formed structures (e.g., access lines, such as word lines) may laterally extend. In some embodiments, the third angle $\theta$ of the lines 132 of the second DARC material 128 is greater than about zero (0) degrees and less than about ninety (90) degrees relative to the first lateral direction, such as within a range of from about twenty (20) degrees to about seventy (70) degrees, from about thirty (30) degrees to about sixty (60) degrees, or from about forty (40) degrees to about fifty (50) degrees. The third angle $\theta$ may be selected at least partially based on a desired architecture of the microelectronic device structure 100, and on desired dimensions of features to be formed from the base material 102, as will be described below.

In some embodiments, the third angle $\theta$ is in an opposite direction relative to the first angle $\alpha$ with respect to the first lateral direction. In other words, in some embodiments, the first angle $\alpha$ is in the one of the clockwise direction and the counterclockwise direction with respect to the first lateral direction and the third angle $\theta$ is in the other of the clockwise direction and the counterclockwise direction with respect to the first lateral direction. In some such embodiments, an angle between the lines 132 of the second DARC material 128 and the first trenches 122 may be equal to a difference between one hundred eighty (180) degrees and the sum of the second angle $\beta$ and the third angle $\theta$ (e.g., 180-$\beta$-$\theta$). In some embodiments, the angle between the lines 132 and the first trenches 122 may be about ninety-eight (98) degrees.

In some embodiments, the third angle $\theta$ is equal to about the first angle $\alpha$, wherein the lines 132 of the second DARC material 128 are oriented at the third angle $\theta$ with respect to the first lateral direction in one of the clockwise direction and the counterclockwise direction and the first trenches 122 are oriented at the first angle $\alpha$ with respect to the first lateral direction in the other of the clockwise direction and the counterclockwise direction. Accordingly, the first angle $\alpha$ and the third angle $\theta$ illustrated in FIG. 1M may be about the same.

Referring now to FIG. 1N and FIG. 1O, after forming the lines 132 of the second DARC material 128, the openings 130 (FIG. 1L, FIG. 1M) may be transferred to the underlayer material 126 to expose portions of the nitride material 110 and the first sacrificial material 108. The nitride material 110 may be selectively removed relative to the first sacrificial material 108 and the etch stop material 104. In some embodiments, the nitride material 110 may be selectively removed relative to the first sacrificial material 108 and the etch stop material 104 by exposing the microelectronic device structure 100 to phosphoric acid. However, the disclosure is not so limited and the nitride material 110 may be selectively removed by other methods.

Removal of the nitride material 110 relative to the first sacrificial material 108 and the etch stop material 104 may form third trenches 135 between adjacent lines 132 of the second DARC material 128 that extend along the microelectronic device structure 100 in the same direction as the lines 132 of the second DARC material 128. Stated another way, the third trenches 135 may be oriented at the third angle θ with respect to the second lateral direction (e.g., the X-direction).

Figure 1P:
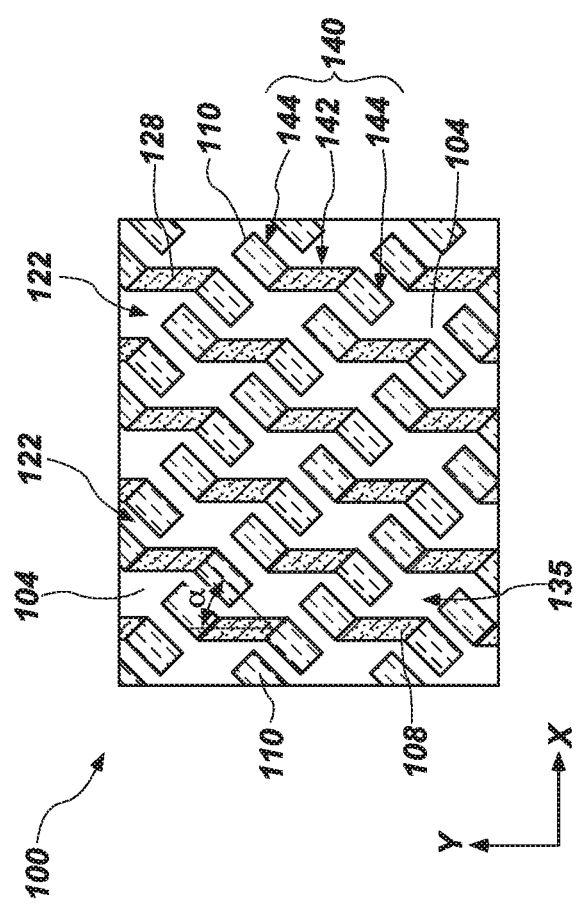

Referring now to FIG. 1P, after removing the nitride material 110 (FIG. 1N) through the openings 130 (FIG. 1L, FIG. 1M) in the second DARC material 128 (FIG. 1N, FIG. 1O), the mask 124 (FIG. 1N) including the second DARC material 128 and the underlayer material 126 may be removed, leaving the patterned first sacrificial material 108 and the nitride material 110 adjacent (e.g., on, over, vertically overlying) the etch stop material 104. By way of non-limiting example, the second DARC material 128 and the underlayer material 126 may be removed using, such as with one or more of hydrofluoric acid, ammonium fluoride, an amine (such as an organic amine such as one or more of ethylene amine, trimethylaminoethylethanolamine (TMAEEA), trimethylaminopropylethanolamine (TMAPEA)), or another material.

Removal of the nitride material 110 may form pillar structures 140 (e.g., elongate pillar structures) comprising a portion of the first sacrificial material 108 and portions of the nitride material 110. In some embodiments, the pillar structures 140 may exhibit an "S" shape. The pillar structures 140 may each individually comprise a central portion 142 comprising the first sacrificial material 108 and end portions 144 comprising the nitride material 110. The end portions 144 may also be referred to herein as "tip portions."

Each of the pillar structures 140 may individually comprise one end portion 144 at a first end (e.g., a first longitudinal end) of the central portion 142 and an additional end portion 144 at a second end (e.g., a second longitudinal end) of the central portion 142.

The end portions 144 may include a longitudinal axis $L_1$ (FIG. 1Q) that extends at the first angle α with respect to a longitudinal axis $L_2$ (FIG. 1Q) of the central portion 142. The longitudinal axis $L_2$ of the central portion 142 may extend in the first lateral direction (e.g., the Y-direction).

Figure 1Q:
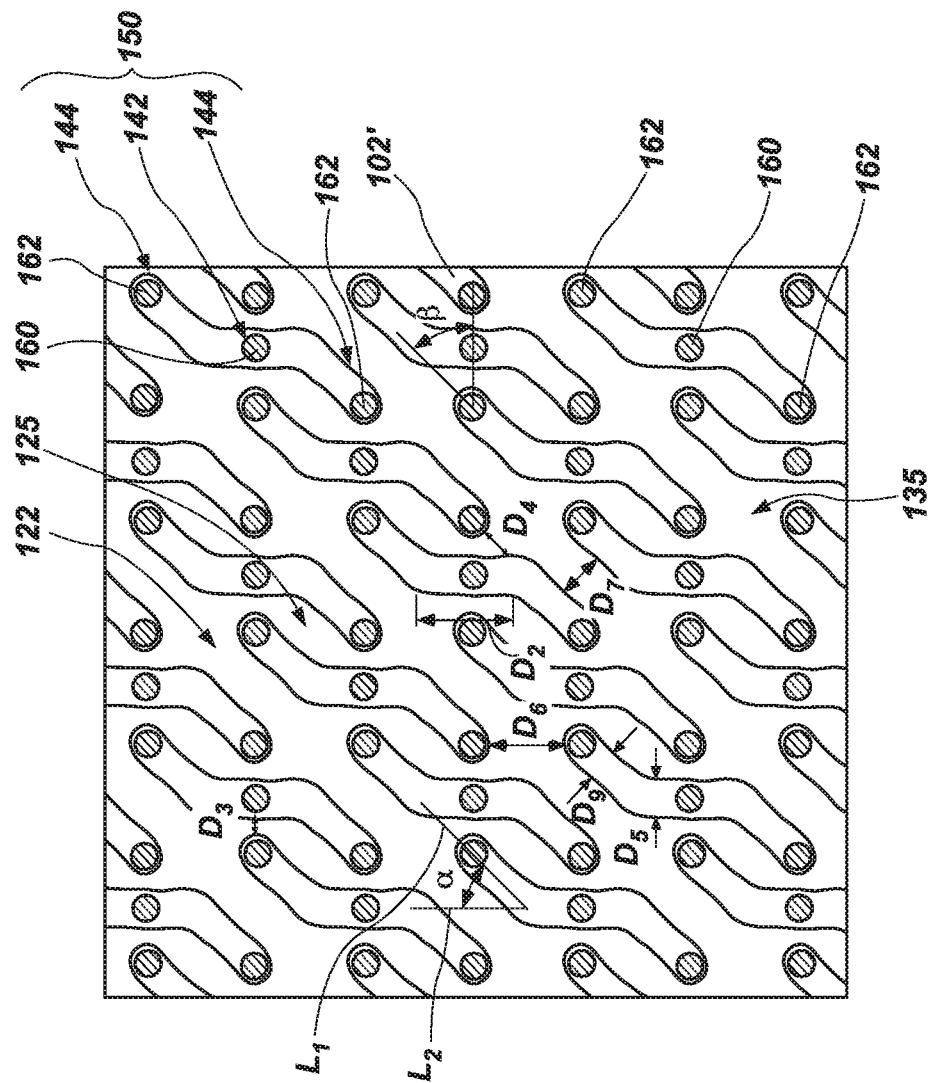

Referring to FIG. 1Q, the pillar structures 140 (FIG. 1P) may be used as a mask to transfer the pattern of the pillar structures 140 to the etch stop material 104 and subsequently to the base material 102. For example, the microelectronic device structure 100 may be exposed to one or more etchants formulated and configured to selectively remove the etch stop material 104 without substantially removing the first sacrificial material 108 or the nitride material 110. By way of non-limiting example, the etch stop material 104 may be exposed to one or more of ammonium hydroxide, hydrogen peroxide, or another material. However, the disclosure is not so limited and the etch stop material 104 may be removed by methods other than those described above.

The patterned etch stop material 104 may be used to transfer the pattern of the pillar structures 140 to the base material 102 to form isolated semiconductive pillar structures 150 (e.g., elongate semiconductive pillar structures) each individually comprising the central portion 142 and the end portions 144, as described above with reference to the pillar structures 140 (FIG. 1P). Thus, after transferring the pattern of the pillar structures 140 (FIG. 1P) to the etch stop material 104, the patterned etch stop material 104 may be used to transfer the pattern to the underlying base material 102 to form the semiconductive pillar structures 150. The semiconductive pillar structures 150 may include rounded edges and correspond to active areas of the microelectronic device structure 100. By way of non-limiting example, portions of the base material 102 exposed through the patterned etch stop material 104 may be removed (e.g., partially removed) to form the pattern of the semiconductive pillar structures 150 separated by trenches (e.g., the first trenches 122, the second trenches 125, and the third trenches 135).

The semiconductive pillar structures 150 may exhibit an elongate shape having a length (e.g., along the longitudinal axis of the central portion 142 and a longitudinal axis of the end portions 144) that is greater than a width of the semiconductive pillar structures 150 in a direction that is substantially perpendicular to the length. The semiconductive pillar structures 150 may include curved (e.g., arcuate) sides. The orientation of the semiconductive pillar structures 150 may be non-linear since the end portions 144 are angled with respect to the central portion 142.

Adjacent semiconductive pillar structures 150 may be spaced from each other by the first trenches 122 and the second trenches 125 oriented at the first angle α with respect to the longitudinal axis $L_2$ of the central portion 142. In some embodiments, the first trenches 122 may extend substantially along the microelectronic device structure 100 without intersecting a semiconductive pillar structure 150 and the second trenches 125 may be interrupted by the central portions of the semiconductive pillar structures 150. In other words, the second trenches 125 may be located between the central portions 142 of the semiconductive pillar structures 150. In addition, the semiconductive pillar structures 150 may be separated from each other by the third trenches 135 extending at the third angle θ with respect to the second lateral direction (e.g., the X-direction). The third trenches 135 may intersect the first trenches 122 and may separate the central portions 142 of adjacent semiconductive pillar structures 150 from each other. In some embodiments, the first trenches 122, the second trenches 125, and the third trenches 135 are filled with a dielectric material.

In some embodiments, the first trenches 122 may separate the end portions 144 of the semiconductive pillar structures 150 from each other. For example, an upper end portion 144 of a first semiconductive pillar structure 150 may be spaced from a lower end portion 144 of a laterally adjacent second semiconductive pillar structure 150 by the first trench 122. In addition, the upper end portion 144 of the first semiconductive pillar structure 150 may be separated from the lower end portion 144 of a laterally adjacent third semiconductive pillar structure 150 by a second trench 125. Similarly, a lower end portion 144 of the first semiconductive pillar structure 150 may be spaced from an upper end portion 144 of a fourth semiconductive pillar structure 150 laterally adjacent the first semiconductive pillar structure 150 by another of the first trenches 122 and spaced from an upper end portion 144 of a laterally adjacent fifth semiconductive pillar structure 150 by another of the second trenches 125.

With continued reference to FIG. 1Q, each of the semiconductive pillar structures 150 may include a digit line (e.g., bit line) contact regions and storage node (e.g., memory cell) contact regions 162. Although the digit line contact regions 160 and the storage node contact regions 162 have been illustrated in FIG. 1Q as having the same lateral dimension as the semiconductive pillar structures 150, it will be understood that the lateral dimension of digit line contact regions 160 and the storage node contact regions 162 may be less than the lateral dimension of the semiconductive pillar structures 150.

The storage node contact regions 162 may be located on (e.g., over) the end portions 144 of the semiconductive pillar structures 150. The digit line contact regions 160 may be located on (e.g., over) the central portions 142 of the semiconductive pillar structures 150. In some embodiments, the digit line contact regions 160 of a first semiconductive pillar structure is laterally aligned with the storage node contact regions 162 of an adjacent second semiconductive pillar structure 150 and a third semiconductive pillar structure 150.

With continued reference to FIG. 1Q, a distance $D_2$ (corresponding to the length of the central portion 142 of the semiconductive pillar structures 150) may be within a range from about 20 nm to about 40 nm, such as from about 20 nm to about 25 nm, from about 25 nm to about 30 nm, from about 30 nm to about 35 nm, or from about 35 nm to about 40 nm. However, the disclosure is not so limited and the distance $D_2$ may be different than those described.

A distance $D_3$ between an end portion 144 of a first semiconductive pillar structure 150 and a central portion 142 of an adjacent, second semiconductive pillar structure 150 (e.g., a distance between a storage node contact region 162 of the first semiconductive pillar structure 150 and the bit line contact region 160) may be within a range from about 10 nm to about 20 nm, such as from about 10 nm to about 15 nm, or from about 15 nm to about 20 nm. However, the disclosure is not so limited and the distance $D_3$ may be different than those described.

A distance $D_4$ between an end portion 144 of a semiconductive pillar structure 150 and a central portion 142 of an adjacent semiconductive pillar structure 150 may be within a range from about 5 nm to about 20 nm, such as from about 5 nm to about 10 nm, from about 10 nm to about 15 nm, or from about 15 nm to about 20 nm. However, the disclosure is not so limited and the distance $D_4$ may be different than those described.

A distance $D_5$ between opposing sides of the central portion 142 may be within a range from about 5 nm to about 15 nm, such as from about 5 nm to about 10 nm, or from about 10 nm to about 15 nm. However, the disclosure is not so limited and the distance $D_5$ may be different than those described.

A distance $D_6$ between an upper end portion 144 of an semiconductive pillar structure 150 and a lower end portion 144 of a vertically adjacent semiconductive pillar structure 150 in a direction substantially parallel with the longitudinal axis $L_4$ of the central portions 142 may be within a range from about 10 nm to about 30 nm, such as from about 10 nm to about 15 nm, from about 15 nm to about 20 nm, from about 20 nm to about 25 nm, or from about 25 nm to about 30 nm. In some embodiments, the distance $D_6$ is about 26 nm. However, the disclosure is not so limited and the distance $D_6$ may be different than those described.

A distance $D_7$ between an upper end portion 144 of an semiconductive pillar structure 150 and a lower end portion 144 of an adjacent semiconductive pillar structure 150 in a direction perpendicular to the sides of the upper end portion 144 and the lower end portion 144 may be within a range from about 5 nm and about 20 nm, such as from about 5 nm to about 10 nm, from about 10 nm to about 15 nm, or from about 15 nm to about 20 nm. However, the disclosure is not so limited and the distance $D_7$ may be different than those described.

A distance $D_9$ between opposing sidewalls of the end portions 144 may be within a range from about 5 nm to about 15 nm, such as from about 5 nm to about 10 nm, or from about 10 nm to about 15 nm. In some embodiments, the distance $D_9$ is substantially the same as the distance $D_5$.

Following the formation of the semiconductive pillar structures 150, the microelectronic device structure 100 may be subjected to additional processing. In some embodiments, the microelectronic device structure 100 may be exposed to one or more ion implantation processes to form so-called source regions, drain regions, and channel regions of transistor structures at least partially formed from the semiconductive pillar structures 150. In some embodiments, the semiconductive pillar structures 150 are exposed to an ion implantation to dope at least upper portions of the patterned base material 102'.

Figure 1R:
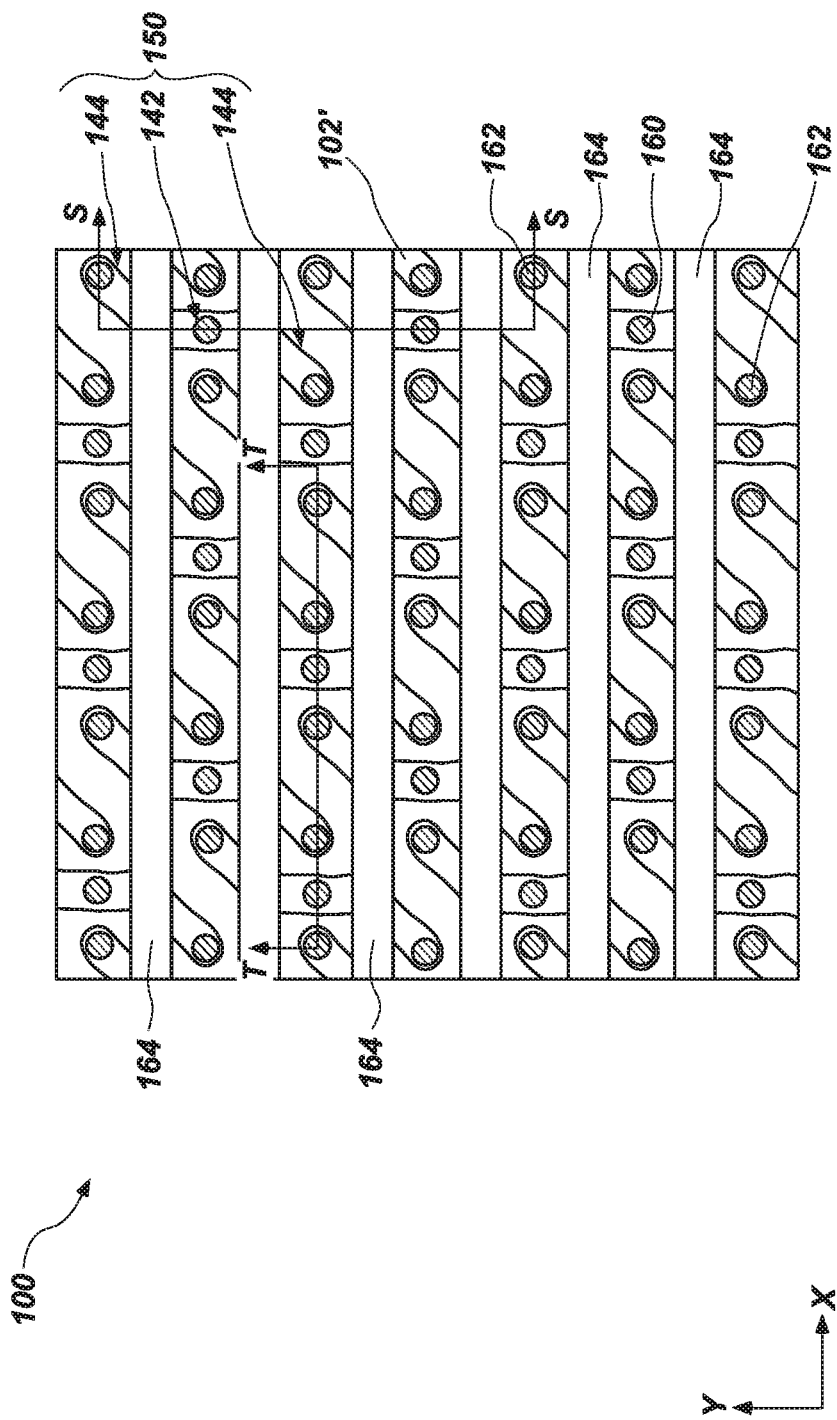
Figure 1T:
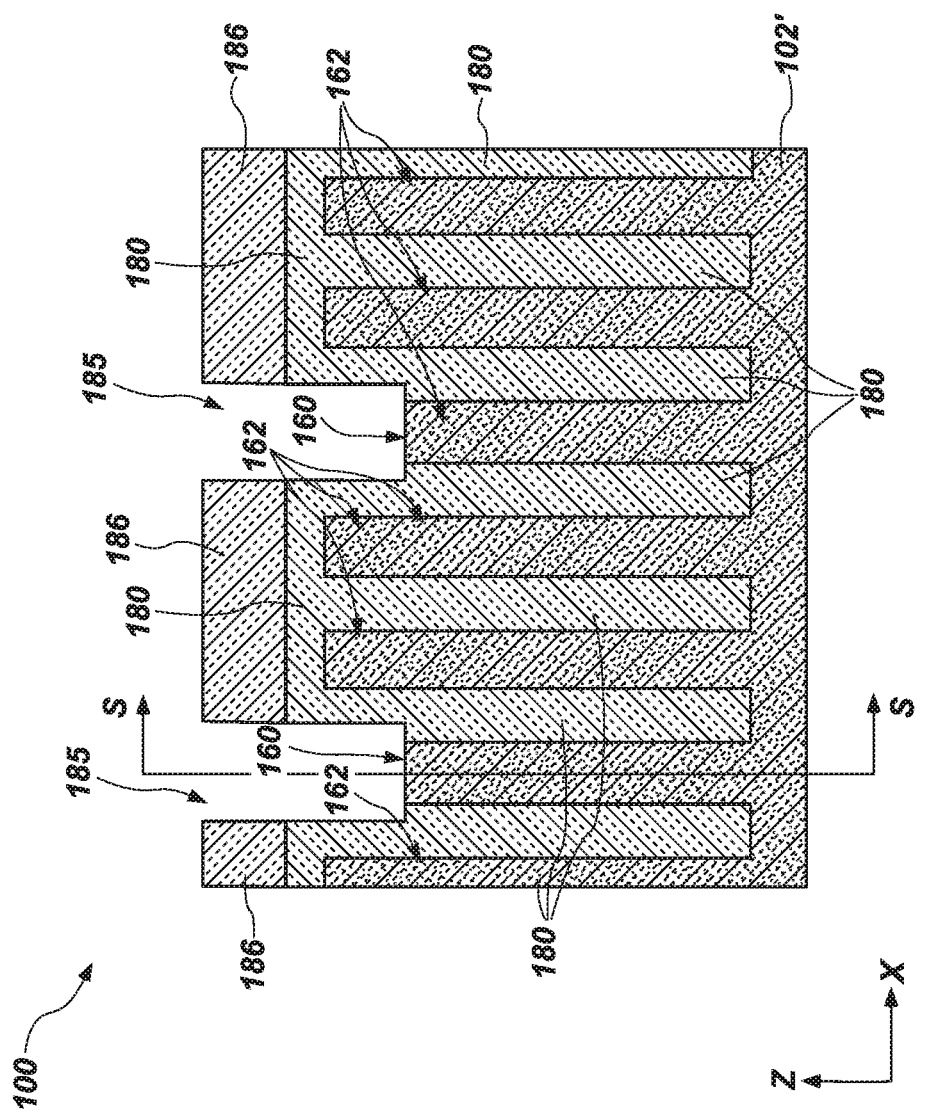

Referring to FIG. 1R, FIG. 1S and FIG. 1T, word lines 164 may be formed within isolation trenches between the storage node contact regions 162 and the digit line contact regions 160. FIG. 1R is a top view of the microelectronic device structure 100 after subjecting the microelectronic device structure 100 to additional processing. FIG. 1S is a simplified cross-sectional view of the microelectronic device structure 100 of FIG. 1R taken through section line S-S of FIG. 1R, and FIG. 1T is a simplified cross-sectional view of the microelectronic device structure 100 of FIG. 1R taken through section line T-T of FIG. 1R.

With reference to FIG. 1R and FIG. 1S an insulative material 180 (not illustrated in FIG. 1R for clarity and ease of understanding the description) may be formed over the microelectronic device structure 100 and may fill regions between adjacent semiconductive pillar structure 150 (e.g., the first trenches 122, the second trenches 125, and the third trenches 135). The insulative material 180 may be formed of and include a dielectric material. In some embodiments, the insulative material 180 comprises silicon dioxide.

After forming the insulative material 180, portions of the insulative material 180 and portions of the semiconductive pillar structures 150 between the central portions 142 and the end portions 144 may be removed. For example, a mask material may be formed over the microelectronic device structure 100 with openings (e.g., trenches) extending in the first lateral direction (e.g., the X-direction) and the portions of the insulative material 180 and portions of the semiconductive pillar structures 150 may be removed through the openings in the mask material.

In some embodiments, after forming the openings, exposed portions of the patterned base material 102' may be exposed to an ion implantation process to form channel regions 181 of transistor structures. A dielectric material 182 (e.g., a gate dielectric material) may be formed within the openings and a conductive material 184 may be formed over the dielectric material 182 to form the word lines 164. The dielectric material 182 may be formed of an include one or more phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), a dielectric carboxynitride material (e.g., silicon carboxynitride (SiOCN))), or combinations thereof.

The conductive material 184 may be formed of and include one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the conductive material 184 comprises one or more of elemental molybdenum, elemental tungsten, and elemental cobalt with one or more of polysilicon, germanium, and silicon germanium.

In some embodiments, and with reference to FIG. 1R, the word lines 164 may separate the central portions 142 from the end portions 144. Stated another way, in some embodiments, the word lines 164 may intervene between the central portions 142 and the end portions 144. Accordingly, the word lines 164 may be located in isolation trenches (e.g., including the insulative material 180) including the word lines 164 therein and separating the digit line contact regions 160 from the storage node contact regions 162 of each of the semiconductive pillar structures 150. Accordingly, the semiconductive pillar structures 150 as described herein may each comprise a central portion 142 spaced from end portions 144 (e.g., a first end portion 144 and a second end portion 144) by word lines 164 (e.g., a first word line 164 and a second word line 164). After forming the word lines 164, remaining portions of the openings may be filled with an insulative material 186, which may include one or more of the materials described above with reference to the insulative material 180. In some embodiments, the insulative material 186 comprises the same material composition as the insulative material 180.

With reference to FIG. 1S and FIG. 1T, after forming the word lines 164, openings 185 may be formed through portions of the insulative material 186 and the insulative material 180 to expose surfaces of the digit line contact regions 160 of the semiconductive pillar structures 150. The openings 185 may be formed by, for example, forming and patterning a mask over the microelectronic device structure 100 and exposing the microelectronic device structure 100 to suitable etchants.

Figure 1U:
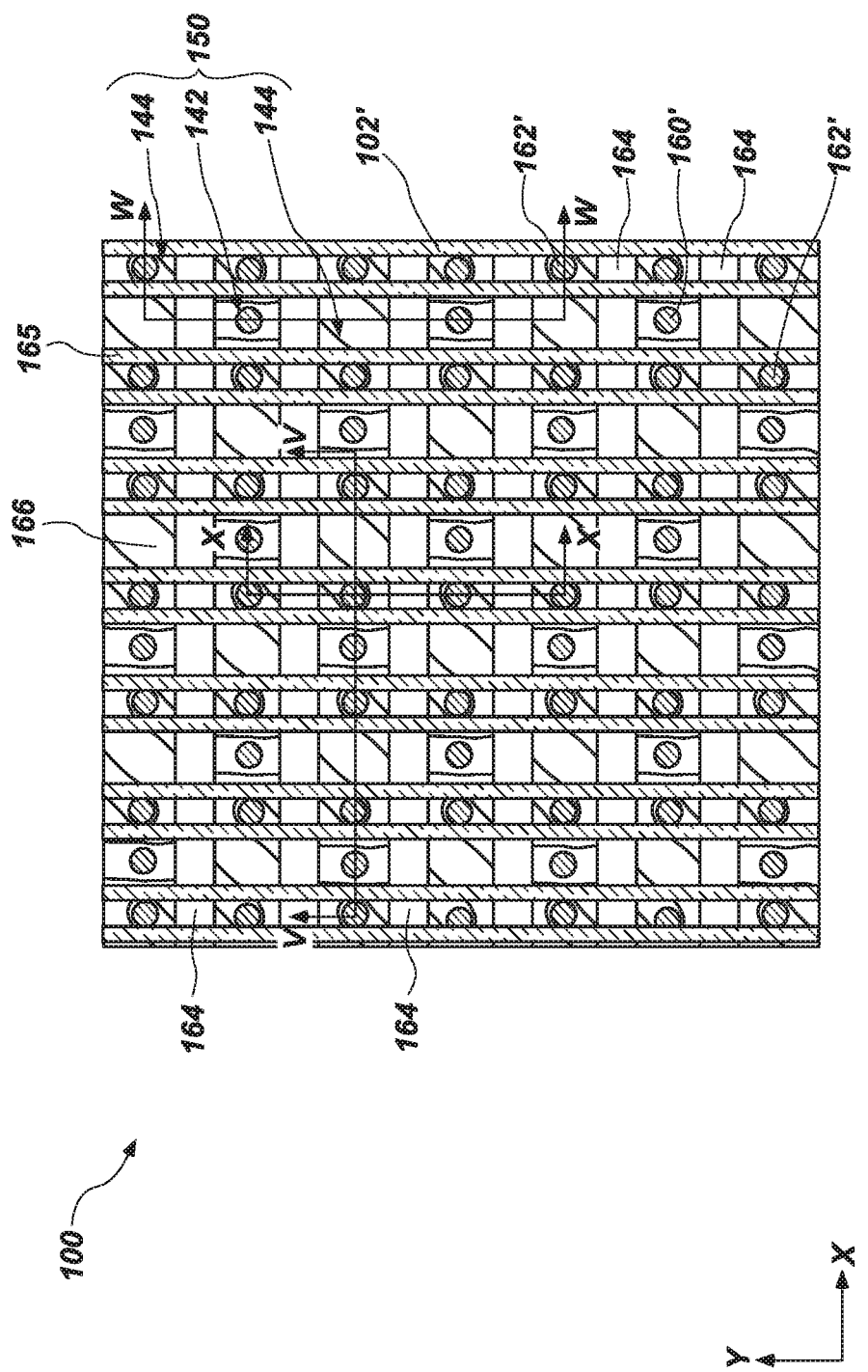
Figure 1V:
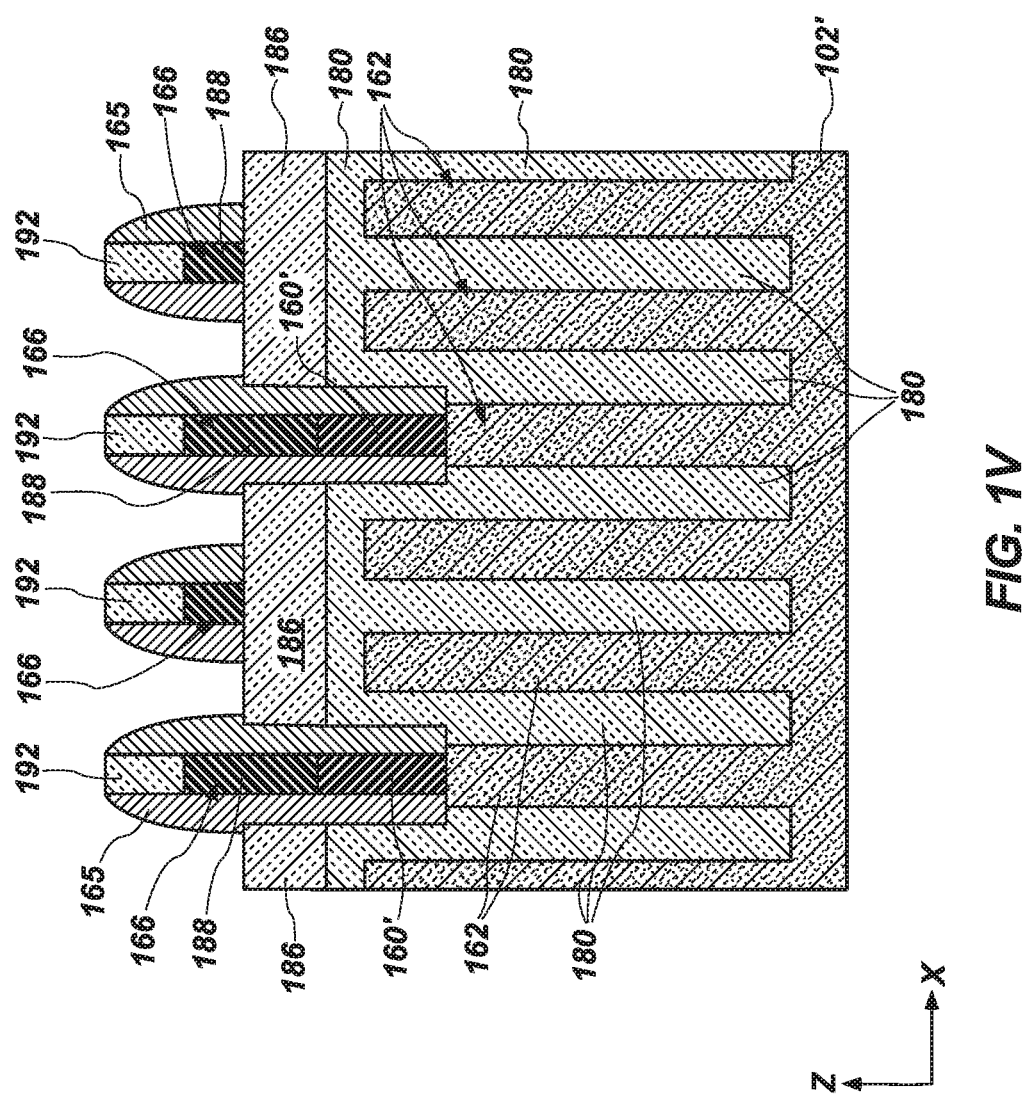
Figure 1W:
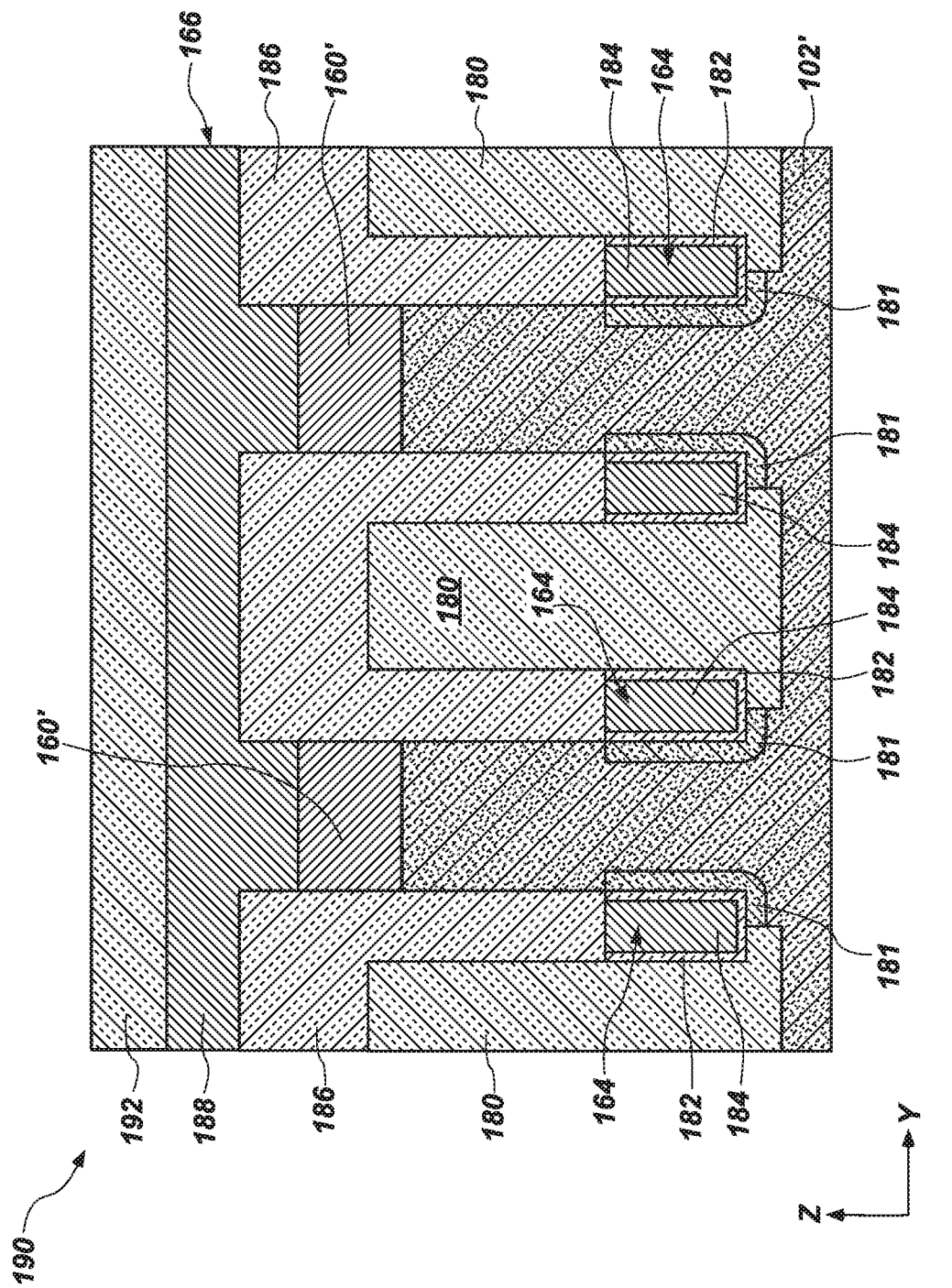

Referring now to FIG. 1U, FIG. 1V, and FIG. 1W, the microelectronic device structure 100 may be subjected to additional processing to form a microelectronic device 190. FIG. 1U is a top view of the microelectronic device 190; FIG. 1V is a cross-sectional view taken through section line V-V of FIG. 1U; and FIG. 1W is a cross-sectional view taken through section line W-W of FIG. 1U. With reference to FIG. 1U through FIG. 1W, digit line contacts 160' may be formed within the openings 185 and on the digit line contact regions 160. The digit line contacts 160' may be formed of and include at least one electrically conductive material. In some embodiments, the digit line contacts 160' comprise one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the digit line contacts 160' comprise one or more of elemental molybdenum, elemental tungsten, and elemental cobalt with one or more of polysilicon, germanium, and silicon germanium. In some embodiments, the digit line contacts 160' comprise doped polysilicon. By way of non-limiting example, the digit line contacts 160' may include at least about $10^{20}$ atom/cm$^3$, or even at least about $10^{21}$ atom/cm$^3$.

In some embodiments, the digit line contacts 160' are recessed within the openings 185 (FIG. 1T). After forming the digit line contacts 160', a conductive material 188 may be formed over the microelectronic device structure 100 and in contact with the digit line contacts 160' to form the digit lines 166. The conductive material 188 of the digit lines 166 may be formed of and include one or more of the materials described above with reference to the word lines 164.

After forming the digit line contacts 160' and the digit lines 166, an insulative material 192 may be formed over the digit lines 166. In some embodiments, spacers 165 (e.g., "bit line spacers," "digit line spacers") may be formed on sides of the digit lines 166. The insulative material 192 and the spacers 165 may individually be formed of and include one or more of the materials described above with reference to the insulative material 180 and the insulative material 186. In some embodiments, the digit lines 166 do not completely fill the openings 185 (FIG. 1T) and the spacers 165 may be located on sides of the digit lines 166 within the openings 185.

A width of the spacers 165 (e.g., in the direction substantially perpendicular to the longitudinal axis $L_4$ of the digit lines 166 (e.g., the X-direction)) may be within a range from about 5 nm to about 20 nm, such as from about 5 nm to about 10 nm, from about 10 nm to about 15 nm, or from about 15 nm to about 20 nm. However, the disclosure is not so limited and the width may be different than those described.

With reference to FIG. 1X, storage node contacts 162' may be formed over the storage node contact regions 162 of the semiconductive pillar structures 150. The storage node contacts 162' may be formed of and include one or more of the materials described above with reference to the digit line contacts 160'.

The storage node contacts 162' may be in electrical communication with the storage node contact regions 162 of the semiconductive pillar structures 140. The storage node contacts 162' may be located between adjacent portions of the insulative materials 186 and the insulative material 192. The storage node contacts 162' may be formed of and include one or more of the materials described above with reference to the digit line contacts 160'. In some embodiments, the storage node contacts 162' comprise doped polysilicon. By way of non-limiting example, the storage node contacts 162' may include at least about $10^{20}$ atom/cm$^3$, or even at least about $10^{21}$ atom/cm$^3$. In some embodiments, the microelectronic device structure 190 is exposed to annealing conditions to diffuse dopants from the digit line contacts 160' and the storage node contacts 162' to form, for example, source regions, drain regions, and the channel regions 181 of transistor structures.

With continued reference to FIG. 1U through FIG. 1X, in some embodiments, the digit line contacts 160' may be aligned in the Y-direction and may be offset from the storage node contacts 162' in the X-direction. In some embodiments, the digit line contacts 160' may not be aligned with any of the storage node contacts 162' in a direction in which the digit lines 166 extend. In addition, the storage node contacts 162' may be aligned with each other in the Y-direction.

The microelectronic device 190 may include memory cells, each including an access transistor (e.g., a transistor comprising a gate along one of the word lines 164) coupled with a storage node structure 194 (e.g., capacitor structure). Only one storage node structure 194 is illustrated in FIG. 1X, but it will be understood that all of the storage node contacts 162' may be coupled to a storage node structure 194.

With continued reference to FIG. 1X, the storage node structures 194 may be formed over and in electrical communication with the storage node contacts 162'. The storage node structures 194 are not illustrated in FIG. 1U for clarity and ease of understanding of the disclosure.

In some embodiments, a redistribution material (RDM) structure 196 (also referred to as "redistribution layer (RDL) structures") may be formed on or over the storage node contacts 162', and the storage node structures 194 and may be in electrical communication with the storage node structures 194 and the storage node contacts 162'.

The RDM structures 196 may be configured to effectively shift (e.g., stagger, adjust, modify) lateral positions (e.g., in the X-direction, in the Y-direction) of the storage node contacts 162' to accommodate a desired arrangement (e.g., a hexagonal close packed arrangement) of the storage node structures 194 over and in electrical communication with the storage node contacts 162'. The RDM structures 196 may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the RDM structures 196 may individually comprise one or more of W, TiN, TaN, WN, TiAlN, Ti, Pt, Rh, Ir, IrO$_x$, Ru, RuO$_x$, and alloys thereof.

The storage node structures 194 may be configured to store a charge representative of a programmable logic state. For example, a charged state of the storage node structures 194 may represent a first logic state (e.g., a logic 1), and an uncharged state of the storage node structures 170 may represent a second logic state (e.g., a logic 0). In some embodiments, the storage node structures 194 comprise a dielectric material configured to store a charge associated with a logic state. The dielectric material may, for example, comprise one or more of include silicon dioxide, silicon nitride, polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfO$_2$), zirconium oxide (ZrO$_2$), a ferroelectric material (e.g., ferroelectric hafnium oxide, ferroelectric zirconium oxide, lead zirconate titanate (PZT), etc.), and a high-k dielectric material. In some embodiments, the storage node structures 170 comprise zirconium oxide.

The RDM structures 196 and the storage node structures 194 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

With returned reference to FIG. 1U through FIG. 1X, in additional embodiments, the microelectronic device 190 is formed to exhibit different lateral geometric configurations (e.g., different lateral shapes, different lateral dimensions) of the semiconductive pillar structures 150 by modifying one or more of the first angle α of the oxide material 118 (FIG. 1C, FIG. 1D) and the corresponding first trenches 122 (FIG. 1E, FIG. 1F), the second angle β of the second trenches 125 (FIG. 1H, FIG. 1I), and the third angle θ of the lines 132 (FIG. 1J, FIG. 1M) of the second DARC material 128 (FIG. 1J, FIG. 1M).

Forming the semiconductive pillar structures 150 to include the central portion 142 and the end portions 144 extending at the first angle α with respect to the central portion 142 may facilitate an increased active area for the digit line contacts 160' on the central portion 142 compared to conventional microelectronic devices. In addition, the size and shape of the semiconductive pillar structure 150 may facilitate an increased landing area (e.g., from about 4 nm to about 5 nm more) for the storage node contacts 162' from a lateral edge of the spacers 165 compared to conventional microelectronic device structures. Further, the spacing of the semiconductive pillar structures 150 facilitates an increased width (e.g., in the X-direction) of the spacers 165, which may facilitate a reduction in capacitive coupling of the digit lines 166 compared to conventional microelectronic devices.

Thus, in accordance with embodiments of the disclosure a microelectronic device comprises semiconductive pillar structures each individually comprising a digit line contact region disposed laterally between two storage node contact regions. At least one semiconductive pillar structure of the semiconductive pillar structures comprises a first end portion comprising a first storage node contact region, a second end portion comprising a second storage node contact region, and a middle portion between the first end portion and the second end portion and comprising the digit line contact region, a longitudinal axis of the first end portion oriented at an angle with respect to a longitudinal axis of the middle portion.

Thus, in accordance with additional embodiments of the disclosure, a method of forming a microelectronic device comprises forming a pattern of first lines of a first sacrificial material over a base material and forming a nitride material in spaces between adjacent first lines, forming second lines of a second sacrificial material over the first lines, the second lines of the second sacrificial material oriented at a first angle within a range from about 30° to about 60° with respect to the first lines, forming an oxide material on sides of the second lines, selectively removing portions of each of the first sacrificial material, the second sacrificial material, and the nitride material with respect to the oxide material, forming a pattern of third lines comprising an underlayer material over remaining portions of the first sacrificial material oriented at a second angle with respect to the remaining portions of the first lines, and removing portions of the nitride material selective to the first sacrificial material through the pattern of third lines to form a pattern of pillar structures.

Thus in accordance with further embodiments of the disclosure, a method of forming a microelectronic device comprises forming first lines comprising silicon in a first direction, forming a nitride material between the first lines, forming second lines comprising silicon in a second direction at a first angle with respect to the first direction, forming spacers on the second lines, removing portions of the first lines and portions of the nitride material through spaces between the spacers, forming lines of a mask extending at a second angle with respect to the first direction, removing portions of the nitride material between the lines of the mask, and removing portions of a semiconductive material adjacent to remaining portions of the first lines and the nitride material to form semiconductive pillar structures.

Figure 2:
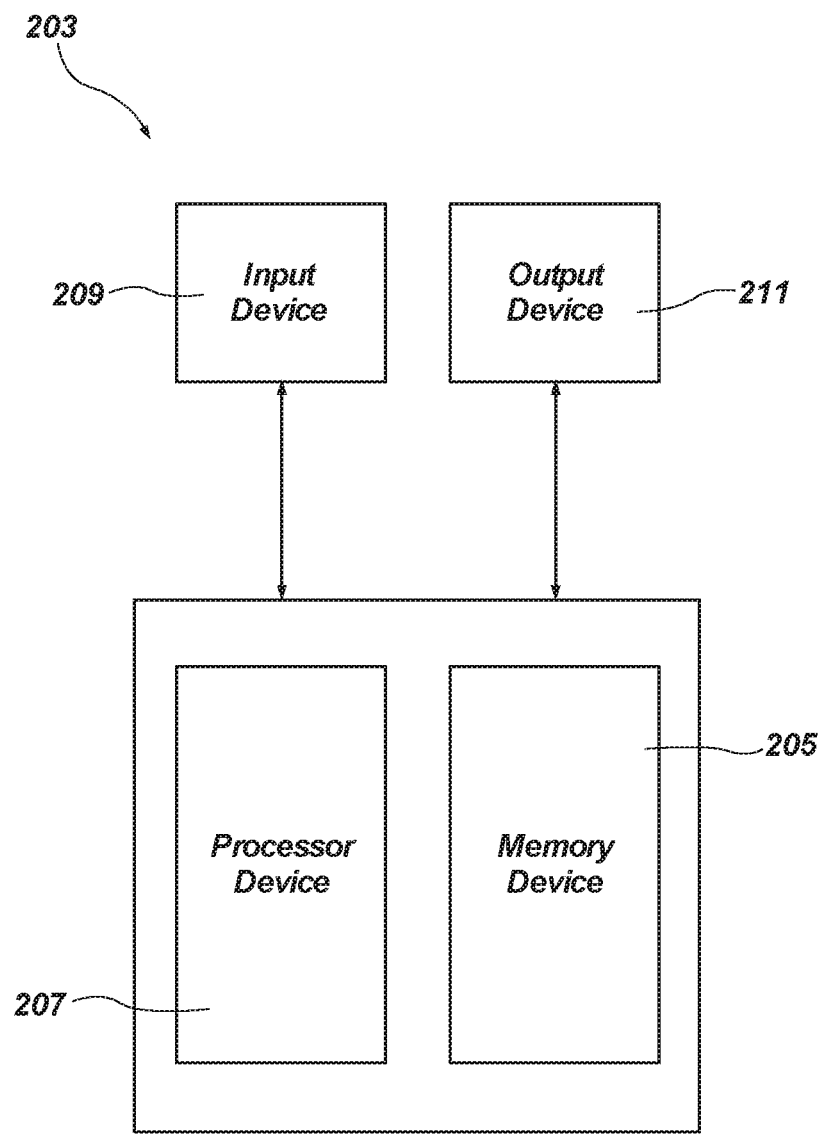
FIG. 2 is a block diagram of an electronic system, in accordance with embodiments of the disclosure.

Microelectronic devices including microelectronic devices (e.g., the microelectronic device 190) and microelectronic device structures (e.g., the microelectronic device structures 100) formed according to embodiments described herein may be used in embodiments of electronic systems of the disclosure. For example, FIG. 2 is a block diagram of an electronic system 203, in accordance with embodiments of the disclosure. The electronic system 203 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 203 includes at least one memory device 205. The memory device 205 may include, for example, an embodiment of a microelectronic device structure previously described herein (e.g., the microelectronic device structure 100) or a microelectronic device (e.g., the microelectronic device 100) previously described with reference to FIG. 1A through FIG. 1T.

The electronic system 203 may further include at least one electronic signal processor device 207 (often referred to as a "microprocessor"). The electronic signal processor device 207 may, optionally, include an embodiment of a microelectronic device or a microelectronic device structure previously described herein (e.g., one or more of the microelectronic device 190 or the microelectronic device structure 100 previously described with reference to FIG. 1A through FIG. 1T). The electronic system 203 may further include one or more input devices 209 for inputting information into the electronic system 203 by a user, such as, for example, a mouse or other pointing device, a keyboard, a touchpad, a button, or a control panel. The electronic system 203 may further include one or more output devices 211 for outputting information (e.g., visual or audio output) to a user such as, for example, a monitor, a display, a printer, an audio output jack, a speaker, etc. In some embodiments, the input device 209 and the output device 211 may comprise a single touchscreen device that can be used both to input information to the electronic system 203 and to output visual information to a user. The input device 209 and the output device 211 may communicate electrically with one or more of the memory device 205 and the electronic signal processor device 207.

Figure 3:
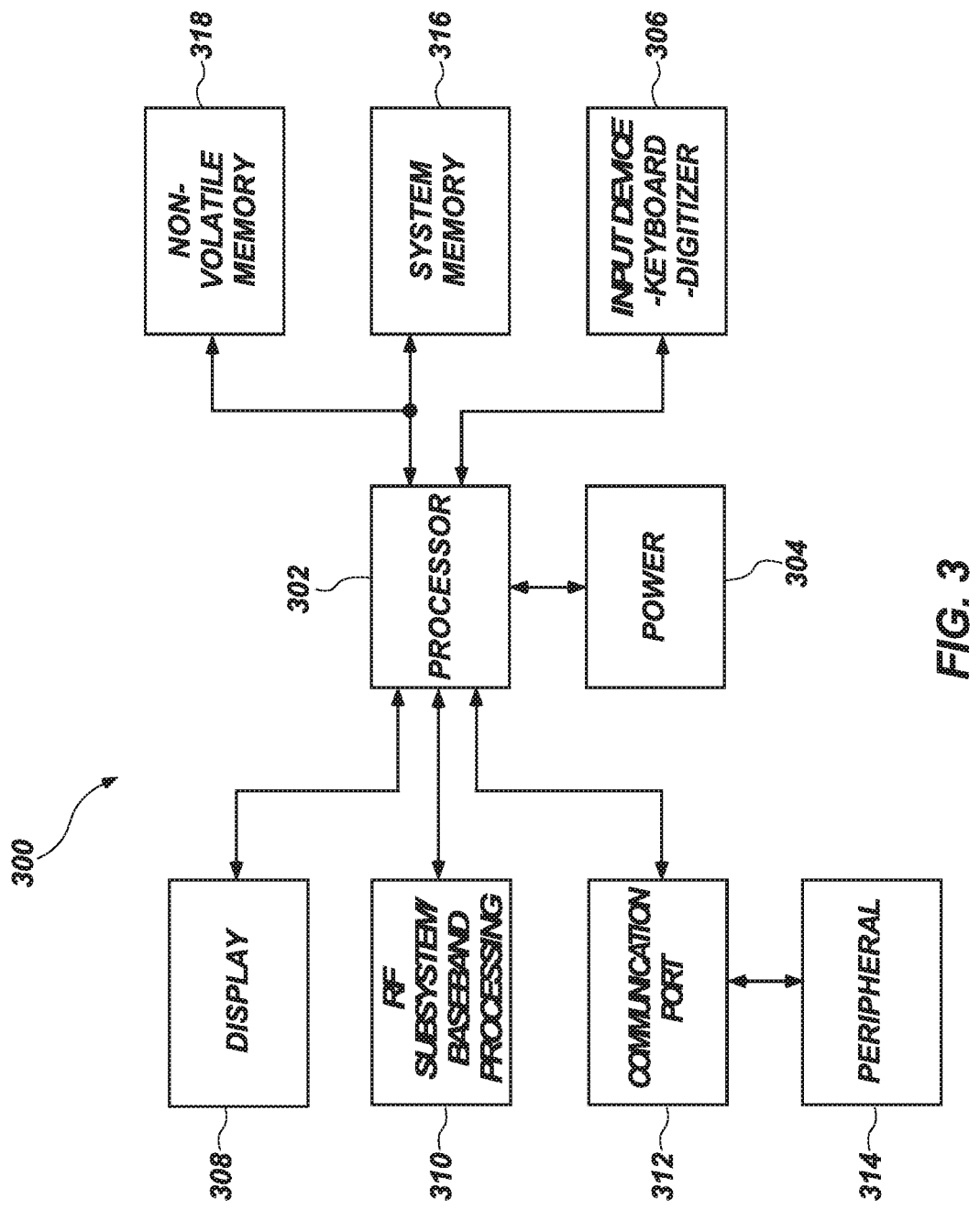
FIG. 3 is a block diagram of a processor-based system, in accordance with embodiments of the disclosure.

With reference to FIG. 3, depicted is a processor-based system 300. The processor-based system 300 may include various microelectronic devices and microelectronic device structures (e.g., microelectronic devices and microelectronic device structures including one or more of the microelectronic device 190 or the microelectronic device structure 100) manufactured in accordance with embodiments of the present disclosure. The processor-based system 300 may be any of a variety of types such as a computer, pager, cellular phone, personal organizer, control circuit, or other electronic device. The processor-based system 300 may include one or more processors 302, such as a microprocessor, to control the processing of system functions and requests in the processor-based system 300. The processor 302 and other subcomponents of the processor-based system 300 may include microelectronic devices and microelectronic device structures (e.g., microelectronic devices and microelectronic device structures including one or more of the microelectronic device 190 or the microelectronic device structure 100) manufactured in accordance with embodiments of the present disclosure.

The processor-based system 300 may include a power supply 304 in operable communication with the processor 302. For example, if the processor-based system 300 is a portable system, the power supply 304 may include one or more of a fuel cell, a power scavenging device, permanent batteries, replaceable batteries, and rechargeable batteries. The power supply 304 may also include an AC adapter; therefore, the processor-based system 300 may be plugged into a wall outlet, for example. The power supply 304 may also include a DC adapter such that the processor-based system 300 may be plugged into a vehicle cigarette lighter or a vehicle power port, for example.

Various other devices may be coupled to the processor 302 depending on the functions that the processor-based system 300 performs. For example, a user interface 306 may be coupled to the processor 302. The user interface 306 may include input devices such as buttons, switches, a keyboard, a light pen, a mouse, a digitizer and stylus, a touch screen, a voice recognition system, a microphone, or a combination thereof. A display 308 may also be coupled to the processor 302. The display 308 may include an LCD display, an SED display, a CRT display, a DLP display, a plasma display, an OLED display, an LED display, a three-dimensional projection, an audio display, or a combination thereof. Furthermore, an RF sub-system/baseband processor 310 may also be coupled to the processor 302. The RF sub-system/baseband processor 310 may include an antenna that is coupled to an RF receiver and to an RF transmitter (not shown). A communication port 312, or more than one communication port 312, may also be coupled to the processor 302. The communication port 312 may be adapted to be coupled to one or more peripheral devices 314, such as a modem, a printer, a computer, a scanner, or a camera, or to a network, such as a local area network, remote area network, intranet, or the Internet, for example.

The processor 302 may control the processor-based system 300 by implementing software programs stored in the memory. The software programs may include an operating system, database software, drafting software, word processing software, media editing software, or media playing software, for example. The memory is operably coupled to the processor 302 to store and facilitate execution of various programs. For example, the processor 302 may be coupled to system memory 316, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 316 may include volatile memory, non-volatile memory, or a combination thereof. The system memory 316 is typically large so that it can store dynamically loaded applications and data. In some embodiments, the system memory 316 may include semiconductor devices, such as the microelectronic devices and microelectronic device structures (e.g., the microelectronic device 190 and the microelectronic device structure 100) described above, or a combination thereof.

The processor 302 may also be coupled to non-volatile memory 318, which is not to suggest that system memory 316 is necessarily volatile. The non-volatile memory 318 may include one or more of STT-MRAM, MRAM, read-only memory (ROM) such as an EPROM, resistive read-only memory (RROM), and flash memory to be used in conjunction with the system memory 316. The size of the non-volatile memory 318 is typically selected to be just large enough to store any necessary operating system, application programs, and fixed data. Additionally, the non-volatile memory 318 may include a high-capacity memory such as disk drive memory, such as a hybrid-drive including resistive memory or other types of non-volatile solid-state memory, for example. The non-volatile memory 318 may include microelectronic devices, such as the microelectronic devices and microelectronic device structures (e.g., the microelectronic device 190 and the microelectronic device structure 100) described above, or a combination thereof.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises semiconductive pillar structures spaced from each other. At least one semiconductive pillar structure of the semiconductive pillar structures comprises a central portion between a first end portion and a second end portion, and a first storage node contact in electrical communication with the first end portion and a second storage node contact in electrical communication with the second end portion. The at least one microelectronic device further comprises a digit line in electrical communication with the central portion, the digit line oriented at an angle from about 30° to about 60° with respect to the first end portion and the second end portion.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   semiconductive pillar structures each individually comprising a digit line contact region disposed laterally between two storage node contact regions, at least one semiconductive pillar structure of the semiconductive pillar structures comprising:
      a first end portion comprising a first storage node contact region;
      a second end portion comprising a second storage node contact region; and
      a middle portion between the first end portion and the second end portion and comprising the digit line contact region, a longitudinal axis of the first end portion oriented at an angle with respect to a longitudinal axis of the middle portion, the longitudinal axis of the first end portion and the longitudinal axis of the middle portion in a lateral plane, the longitudinal axis of the first end portion extending substantially parallel to opposing sides defining the first end portion; and
   digit lines vertically adjacent to the semiconductive pillar structures, the middle portion of each semiconductive pillar structure laterally aligned with a digit line along a longitudinal extent of the middle portion.

2. The microelectronic device of claim 1, wherein a longitudinal axis of the second end portion is oriented at an angle with respect to the longitudinal axis of the middle portion.

3. The microelectronic device of claim 1, wherein the at least one semiconductive pillar structure exhibits a substantially non-linear orientation in the lateral plane.

4. The microelectronic device of claim 1, wherein the angle is within a range from about 30° and about 60°.

5. The microelectronic device of claim 1, wherein the angle is within a range from about 40° to about 50°.

6. The microelectronic device of claim 1, wherein the first storage node contact region is longitudinally and laterally offset from the second storage node contact region.

7. The microelectronic device of claim 1, further comprising:
   storage node contacts at the two storage node contact regions of each of the semiconductive pillar structures;
   a digit line contact at the digit line contact region of each of the semiconductive pillar structures, the digit lines individually in electrical communication with the digit line contact of each of the semiconductive pillar structures;
   word lines laterally extending in a different direction than the digit lines, the word lines spacing the middle portion from each of the first end portion and the second end portion; and
   storage node structures individually in electrical communication with the storage node contacts, and positioned proximate intersections of the digit lines and the word lines.

8. The microelectronic device of claim 1, wherein the digit line contact region of a first semiconductive pillar structure is located laterally adjacent a storage node contact region of a second semiconductive pillar structure.

9. The microelectronic device of claim 8, wherein the digit line contact region of the first semiconductive pillar is located laterally between the storage node contact region of the second semiconductive pillar and a storage node contact region of a third semiconductive pillar.

10. An electronic system, comprising:
    an input device;
    an output device;
    a processor device operably coupled to the input device and the output device; and
    a memory device operably coupled to the processor device and comprising at least one microelectronic device, the at least one microelectronic device comprising:
       semiconductive pillar structures spaced from each other, at least one semiconductive pillar structure comprising:
          a central portion between a first end portion and a second end portion; and
          a first storage node contact in electrical communication with the first end portion and a second storage node contact in electrical communication with the second end portion;
       a digit line in electrical communication with the central portion, the digit line oriented at an angle from about 30° to about 60° with respect to first opposing lateral sides defining the first end portion, the digit line substantially parallel to second lateral opposing sides defining the central portion; and
       word lines extending between the central portion and each of the first storage node contact and the second storage node contact of the semiconductive pillar structures, elongated portions of the word lines individually extending substantially orthogonal to the second lateral opposing sides of the central portion.

11. The electronic system of claim 10, wherein the angle is about 49°.

12. The electronic system of claim 10, wherein the first opposing lateral sides are oriented at the angle with respect to the second lateral opposing sides.

13. The electronic system of claim 10, wherein a length of the first end portion in a direction substantially parallel to the first opposing lateral sides is greater than a distance between the first opposing lateral sides.

14. The electronic system of claim 10, wherein the semiconductive pillar structures comprise silicon.

15. A microelectronic device, comprising:
    a semiconductive pillar structure comprising a middle portion between a first end portion and a second end portion, lateral sides defining the middle portion oriented at an angle with respect to additional lateral sides defining the first end portion;

a digit line contact overlying and in contact with the middle portion;

a first storage node contact overlying and in contact with the first end portion;

a second storage node contact overlying and in contact with the second end portion;

an additional semiconductive pillar structure horizontally neighboring the semiconductive pillar structure in a first horizontal direction, the additional semiconductive pillar structure comprising an additional first end portion horizontally neighboring the middle portion of the semiconductive pillar structure in the first horizontal direction and horizontally aligned with the middle portion of the semiconductive pillar structure in a second horizontal direction; and a digit line extending in the second horizontal direction and in contact with the digit line contact, a length of the digit line laterally aligned with the middle portion of the semiconductive pillar structure along a length of the middle portion.

16. The microelectronic device of claim 15, further comprising word lines horizontally neighboring the additional first end portion of the additional semiconductive pillar structure and the middle portion of the semiconductive pillar structure in the second horizontal direction.

17. The microelectronic device of claim 16, wherein the additional first end portion of the additional semiconductive pillar structure and the middle portion of the semiconductive pillar structure are horizontally between a first word line and a second word line.

18. The microelectronic device of claim 15, wherein the additional semiconductive pillar structure comprises an additional middle portion between the additional first end portion and an additional second end portion.

19. The microelectronic device of claim 18, wherein the additional middle portion of the additional semiconductive pillar structure is horizontally aligned in the second horizontal direction with the second end portion of the semiconductive pillar structure.

20. The microelectronic device of claim 15, wherein the digit line is horizontally offset from the first end portion and the second end portion in the first horizontal direction.

* * * * *